United States Patent
Narita et al.

(10) Patent No.: US 7,806,642 B2
(45) Date of Patent: Oct. 5, 2010

(54) RECEIVER FOR COMPONENT FEED PLATES AND COMPONENT FEEDER

(75) Inventors: Shoriki Narita, Osaka (JP); Kenichi Ishida, Osaka (JP); Shuichi Hirata, Osaka (JP); Satoshi Shida, Osaka (JP)

(73) Assignee: Panasonic Corporation, Osaka (JP)

( * ) Notice: Subject to any disclaimer, the term of this patent is extended or adjusted under 35 U.S.C. 154(b) by 927 days.

(21) Appl. No.: 11/579,735

(22) PCT Filed: Apr. 20, 2005

(86) PCT No.: PCT/JP2005/007532

§ 371 (c)(1),
(2), (4) Date: Nov. 7, 2006

(87) PCT Pub. No.: WO2005/112535

PCT Pub. Date: Nov. 24, 2005

(65) Prior Publication Data

US 2007/0227941 A1    Oct. 4, 2007

(30) Foreign Application Priority Data

May 13, 2004  (JP) .................. 2004-142984

(51) Int. Cl.
*H01L 21/677* (2006.01)
(52) U.S. Cl. .............. 414/217.1; 206/217; 206/459.5; 206/710; 206/711
(58) Field of Classification Search ........ 206/711, 206/710, 719, 722, 454, 459.5; 211/41.12; 414/217, 217.1
See application file for complete search history.

(56) References Cited

U.S. PATENT DOCUMENTS

| | | | | | |
|---|---|---|---|---|---|
| 4,721,207 | A | * | 1/1988 | Kikuchi | 206/307 |
| 4,757,895 | A | * | 7/1988 | Gelzer | 206/479 |
| 4,943,457 | A | | 7/1990 | Davis et al. | |
| 5,452,795 | A | * | 9/1995 | Gallagher et al. | 206/711 |
| 6,082,540 | A | * | 7/2000 | Krampotich et al. | 206/445 |
| 6,267,245 | B1 | * | 7/2001 | Bores et al. | 206/711 |
| 6,446,806 | B1 | * | 9/2002 | Ohori et al. | 206/454 |
| 6,770,109 | B2 | * | 8/2004 | Tanaka et al. | 55/385.6 |
| 6,951,284 | B2 | * | 10/2005 | Cheesman et al. | 206/711 |
| RE40,513 | E | * | 9/2008 | Krampotich et al. | 206/445 |
| 7,455,180 | B2 | * | 11/2008 | Sumi et al. | 206/710 |
| 2003/0070960 | A1 | * | 4/2003 | Chen et al. | 206/711 |
| 2003/0221985 | A1 | * | 12/2003 | Yajima et al. | 206/454 |
| 2005/0223581 | A1 | * | 10/2005 | Hale | 33/758 |

FOREIGN PATENT DOCUMENTS

JP        62-169347        7/1987

(Continued)

*Primary Examiner*—David T Fidei
(74) *Attorney, Agent, or Firm*—Wenderoth, Lind & Ponack, L.L.P.

(57) ABSTRACT

In a receiver for component feed plates for housing, in multi-stage stacks, a plurality of component feed plates with a plurality of components placed thereon, identification mark portions are formed so as to be placed at end portions or their proximities of support guide portions in a plate feed direction so that each paired set of support guide portions out of individual support guide portions can be distinguished from the other paired sets of support guide portions and moreover visually discerned in the plate feed direction.

21 Claims, 36 Drawing Sheets

FOREIGN PATENT DOCUMENTS

| | | |
|---|---|---|
| JP | 2-155244 | 6/1990 |
| JP | 6-70241 | 9/1994 |
| JP | 6-247484 | 9/1994 |
| JP | 9-237798 | 9/1997 |
| JP | 9-289244 | 11/1997 |
| JP | 2000-91385 | 3/2000 |
| JP | 2000-164686 | 6/2000 |
| JP | 2001-244323 | 9/2001 |

* cited by examiner

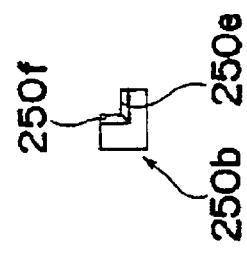
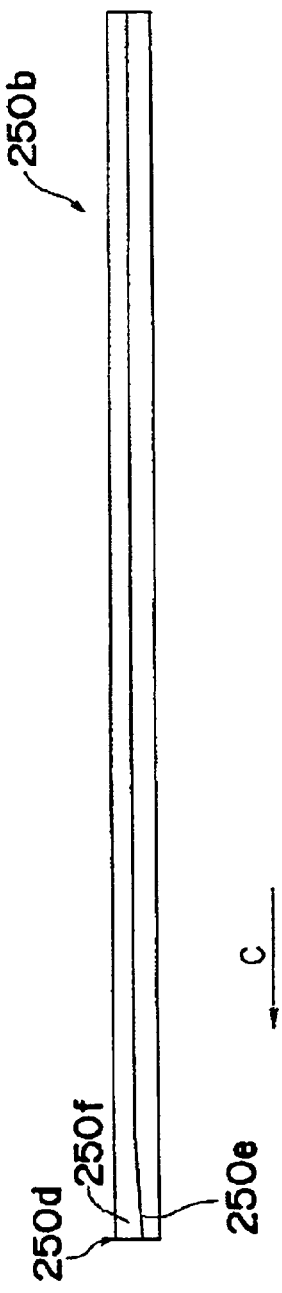

RECEIVER FOR COMPONENT FEED PLATES AND COMPONENT FEEDER

TECHNICAL FIELD

The present invention relates to a receiver for component feed plates (or plate receiving unit), as well as a component feeder, for housing multi-stage stacks of a plurality of component feed plates on which a plurality of components to be mounted on a board are feedably placed, where moving the housed component feed plates in a plate feed direction which is a direction extending along surfaces of the component feed plates, allows the component feed plates to be extracted so that the individual components placed thereon can be fed.

BACKGROUND ART

Conventionally, this type of the receiver for component feed plates, which is called a magazine cassette for example, is used in component feeders that perform component feed for component mounting. In such a magazine cassette, either wafer feed plates for placing thereon wafers on which a plurality of wafer feed components out of the components to be mounted on a board are set, or tray feed plates for placing thereon component feed trays on which a plurality of tray feed components are set, are selectively housed. Further, under the condition that the magazine cassette, having the individual plates housed therein, is set in a component feeder, the wafer feed plates or the tray feed plates are extracted from the magazine cassette in the component feeder to perform the component feed for component mounting of the individual wafer feed components or tray feed components (see, e.g., patent document 1).

Also, in such a magazine cassette, recess portions are formed, for example, of a pair of plural sets of support guide portions which support mutually opposing end portions of the individual plates while keeping a generally horizontal support posture, and which allow the supported respective plates to be slid and moved. In this way, by the individual recess portions formed in the magazine cassette, it becomes implementable to extract a selected plate from the magazine cassette by sliding and moving the selected plate along the individual recess portions while a multiplicity of plates are housed efficiently in vertically stacked-up stages.

Patent document 1: Japanese unexamined patent publication No. 2000-91385

DISCLOSURE OF INVENTION

Problems to be Solved by the Invention

In recent years, there has been a growing demand for improvement in productivity efficiency of component mounting. Therefore, for efficiency improvement of component feed, it has been a practice to make the individual plates smaller in thickness and the individual recess portions smaller in their placement distance in the magazine cassette to thereby increase the number of plates to be housed in stacks of stages in one magazine cassette.

Furthermore, in such component mounting, it has also been demanded to mount scaled-down components on a board with high precision while the improvement of productivity efficiency is sought. In order to meet such a demand, it has been desired to provide reliable feed of plates from the magazine cassette, i.e., reliable execution of component feed.

However, with such a component feeder, upon hold and extraction of a plate from the magazine cassette, for example, by the plate having a generally disc-shaped configuration, there are some cases where a plate 706 is housed in a slanted posture relative to a plate extraction direction C within a magazine cassette 750 as shown in a schematic view of FIG. 42. In such a case, it may occur that a peripheral portion of the plate 706 and recess portions 750b of the magazine cassette 750 come into contact (or collision) with each other, causing the occurrence of rattling of the plate 706.

In particular, in a case where the plate 706 is a tray feed plate on which a plurality of tray feed components are to be placed on its top surface, such an occurrence of rattling as described above may cause the individual set-on tray feed components to scatter from the tray feed plate, in which case reliable component feed is inhibited, posing a problem that efficient component feed cannot be achieved. While the possibility of the occurrence of such problems can be reduced by the operator ascertaining the posture of each plate 706 upon the housing of the plate 706 onto the magazine cassette 750, taking the working time for the ascertainment would cause an increase in the time required for the housing of the individual plates 706, thus inhibiting the efficiency improvement of component feed to the contrary.

Further, in the magazine cassette 750, a narrowed pitch of the individual recess portions 750b may make it difficult to support and house a plate 706 to a paired set of mutually opposing recess portions 750b in the operation of housing the individual plates 706 to the magazine cassette 750 by the operator, as shown in a schematic explanatory view of FIG. 43, where it may become difficult to house the plate 706 in a horizontal support posture in the magazine cassette 750 (i.e., a skewed housing state). In such a case, there would occur an obstacle to the extraction work of the plate 706 from the magazine cassette 750, with the result that reliable, efficient component feed is inhibited.

Moreover, in the case where the plate 706 that is housed in an inclined support posture is extracted in such a state in the magazine cassette 750 as described above, not only it is difficult to reliably extract the plate, but also frictional resistance due to contact between the individual recess portions 750b, which support the individual end portions of the plates 706, and the recess portions becomes larger as compared to the case where the plate is housed in a normal support posture, so that the end portions of the plate 706 or the recess portions 750b are cut in, resulting in occurrence of chips. In such a case, there may also occur a problem that the resulting chips adhere to the surfaces of components or the like, by which reliable component feed for high-precision component mounting is inhibited.

Accordingly, an object of the present invention, lying in solving these and other issues described above, is to provide a receiver for component feed plates, as well as a component feeder, which serves for housing in multi-stage stacks of a plurality of component feed plates with a plurality of components set thereon, and which are capable of solving various issues due to the housing posture of the component feed plates and achieving reliable, efficient extraction of the individual housed plates.

Means for Solving the Problems

In order to achieve the above object, the present invention has the following constitutions.

According to a first aspect of the present invention, there is provided a receiver for component feed plates comprising:

a plurality of paired sets of support guide portions for supporting mutually opposing end portions of a plurality of component feed plates on which a plurality of components to be mounted on a board are feedably placed, so that the plates are supported in a generally horizontal support posture so as to be movable and guidable along a plate feed direction which is one direction extending along surfaces of the component feed plates; and identification mark portions placed at end portions or their proximities of the support guide portions in the plate feed direction so that each of the individual paired sets of support guide portions out of the support guide portions is distinguished from the other paired sets of support guide portions and visually discerned in the plate feed direction, wherein the plates are supported at their end portions by the individual paired sets of support guide portions identified by the identification mark portions, by which the plates are housed in multi-stage stacks, and the component feed plates are moved in the plate feed direction while being guided by the support guide portions, by which the housed component feed plates are extracted respectively for feed of the individual components placed on the plate.

According to a second aspect of the present invention, there is provided the receiver for component feed plates as defined in the first aspect, further comprising a plate replacement opening for allowing execution of replacement of the plates, wherein the identification mark portions are placed so as to be discernable through the plate replacement opening.

According to a third aspect of the present invention, there is provided the receiver for component feed plates as defined in the first aspect, wherein the identification mark portions are formed by machining part of configurations of the end portions or their proximities of the support guide portions.

According to a fourth aspect of the present invention, there is provided the receiver for component feed plates as defined in the first aspect, wherein one paired set of the support guide portions at which the identification mark portions are placed and one paired sets of the support guide portions at which the identification mark portions are not placed are placed vertically alternately.

According to a fifth aspect of the present invention, there is provided the receiver for component feed plates as defined in the first aspect, further comprising a plurality of posture guide members which are placed between the support guide portions of each sets of the support guide portions and which are to be engaged with the plates to thereby guide support posture of the plates in the plate feed direction.

According to a sixth aspect of the present invention, there is provided the receiver for component feed plates as defined in the fifth aspect, further comprising a door which is openable and closable and which serves for replacing the plates, wherein the posture guide members are placed inside the door.

According to a seventh aspect of the present invention, there is provided the receiver for component feed plates as defined in the sixth aspect, further comprising an opening/closing detection sensor for detecting opening/closing of the door.

According to an eighth aspect of the present invention, there is provided the receiver for component feed plates as defined in the first aspect, wherein smooth surface portions are formed at contact portions of the housed plates with the individual support guide portions.

According to a ninth aspect of the present invention, there is provided the receiver for component feed plates as defined in the first aspect, wherein in order that any positional shift between an insertion position of the plates into the respective sets of support guide portions in a direction generally perpendicular to the move direction of the plates and a support position of the plates by the respective sets of support guide portions is corrected, slant portions with respect to the move direction are formed.

According to a tenth aspect of the present invention, there is provided the receiver for component feed plates as defined in the eighth or ninth aspect, wherein mutual contact surfaces between the plates and the support guide portions, respectively, are so formed that hardness of the support guide portion is lower than hardness of the plate in the individual contact surfaces.

According to an eleventh aspect of the present invention, there is provided the receiver for component feed plates as defined in the eighth or ninth aspect, wherein mutual contact surfaces between the plates and the support guide portions, respectively, are so formed that hardness of the plate is lower than hardness of the support guide portion in the individual contact surfaces.

According to a twelfth aspect of the present invention, there is provided the receiver for component feed plates as defined in the eighth or ninth aspect, wherein each of the support guide portions includes a roller which is rotatable along a surface of an end portion of the plate while supporting the end portion.

According to a thirteenth aspect of the present invention, there is provided the receiver for component feed plates as defined in the first aspect, wherein a support surface for supporting the receiver for component feed plates to a base has a plurality of fixing members by which positions of the support are fixed, and at least one of the fixing members is formed of an electrically conductive material to have a function as a grounding terminal.

According to a fourteenth aspect of the present invention, there is provided the receiver for component feed plates as defined in the first aspect, wherein each of the component feed plates is a wafer feed plate for placing thereon a wafer with a plurality of wafer feed components placed thereon as the individual components, or a tray feed plate for placing thereon a component feed tray with a plurality of tray feed components placed thereon as the individual components, and the wafer feed plate and the tray feed plate is compositely housed in stacked-up stages.

According to a fifteenth aspect of the present invention, there is provided a component feeder comprising:

the receiver for component feed plates as defined in the fourteenth aspect;

a plate placement device for holding one of plates out of the individual plates selectively placed so that the wafer feed components are fed from the wafer or the tray feed components are fed from the component feed tray; and a plate moving device for releasably holding the plates and extracting the plates from the plate storage device, and moving the plates to the plate placement device so that the plate placement device can hold the plates.

According to a sixteenth aspect of the present invention, there is provided a receiver for component feed plates comprising:

a plurality of paired sets of support guide portions for supporting mutually opposing end portions of a plurality of component feed plates on which a plurality of components to be mounted on a board are feedably placed, so that the plates are supported in a generally horizontal support posture so as to be movable and guidable along a plate feed direction which is one direction extending along surfaces of the component feed plates; and a plurality of posture guide members which are placed between the support guide portions of each sets of the support guide portions and which are to be engaged with the plates to thereby guide support posture of the plates in the plate feed direction, wherein the plates are supported at their end portions by the individual paired sets of support guide portions, while the plates are guided in their support posture by the posture guide members, by which the plates are housed in multi-stage stacks, and the component feed plates are moved in the plate feed direction while being guided by the support guide portions, by which the housed component feed plates are extracted respectively for feed of the individual components placed on the plate.

According to a seventeenth aspect of the present invention, there is provided the receiver for component feed plates as defined in the sixteenth aspect, further comprising a door which is openable and closable and which serves for replacing the plates, wherein the posture guide members are placed inside the door.

According to an eighteenth aspect of the present invention, there is provided the receiver for component feed plates as defined in the seventeenth aspect, further comprising an opening/closing detection sensor for detecting opening/closing of the door.

EFFECTS OF THE INVENTION

According to the first aspect of the present invention, since the receiver for component feed plates includes identification mark portions by which each of the individual paired sets of support guide portions out of the support guide portions for supporting the plates in a generally horizontal support posture can be discriminated from the other upper- and lower-step paired sets of support guide portions, it becomes possible to reliably and visually prevent the possibility that the plate may be housed in a skewed housing state during the process of housing the plate into the plate housing by the operator or the like.

Also, since such identification mark portions are placed at end portions or their proximities of the support guide portions in a plate feed direction so that the operator is allowed to discern the identification mark portions in the plate feed direction of the plate housing, their visual distinction by the operator can be embodied concretely.

Therefore, the occurrence of such skewed housing can be prevented in advance, so that reliable feed of the plates can be fulfilled and efficient component feed can be implemented. Further, the occurrence of chips that would be generated upon extraction of the plate that has been in a skewed housing can reliably be prevented, and component feed conforming to higher-precision component mounting can be implemented through the fulfillment of the component feed in a cleaned environment.

According to the second aspect of the invention, since the plate housing further includes a plate replacement opening for execution of replacement of the plates, and since the identification mark portions are placed so as to be distinguishable from the plate replacement opening, the operator who performs the replacement work for the plates to the plate housing is enabled to visually recognize the presence or absence of any abnormality of the support posture of the plates according to the placement relationship between the support posture of the plates to be housed and the identification mark portions. Thus, the plates can be housed into the plate housing in a generally horizontal support posture with reliability.

According to the third aspect of the invention, since the identification mark portions are formed by machining part of configurations of the end portions of the support guide portions, the identification mark portions can be formed more easily, as compared with cases where, for example, patterned marked portions are formed by applying seals or coating.

According to the fourth aspect of the invention, since the identification mark portions are formed alternately in the sets of support guide portions, their identification property can be enhanced even if the support guide portions are formed at a narrowed interval pitch. Thus, the support posture of the plates can be recognized with reliability.

Furthermore, according to the other aspects of the invention, since the plate housing further includes a plurality of posture guide members which are placed between the sets of support guide portions and engaged with the plates to thereby guide the support posture of the plates in the plate feed direction, i.e., their support posture in the horizontal direction, the housing posture of the plates into the plate housing can be maintained in a normal state, so that the housing and extraction of the plates into and from the plate housing can be performed smoothly.

Also, in the case where such posture guide members are included inside the door of the plate housing, closing the door allows the plates and the posture guide members to be engaged with each other, respectively, so that the horizontal posture can be set into a normal state.

Also, in the case where the opening/closing detection sensor for detecting opening/closing of the door is included, it can be decided that the plates have been stored in the normal posture only when a closure of the door is detected by the opening/closing detection sensor, so that the storage posture of the plates can be controlled efficiently.

Also, in the case where the contact portions of the plates with the support guide portions have the smooth surface portions, frictional force occurring to the contact portions can be reduced, so that occurrence of chips or the like due to the contact wear can be prevented. Such occurrence of chips would cause the maintainability of the component feeder to degrade and also may cause, in some cases, functional problems such as contamination of the mounting surfaces of the component boards or the like. Therefore, the frequency of occurrence of such problems can be reduced to a great extent. For example, even when the wafer feed plates and the tray feed plates that are relatively heavier in weight so as to have a possibility of causing the occurrence of chips are compositely placed and fed among the plates, the maintainability of the component feeder can be enhanced and so efficient component feed can be implemented.

Also, in the case where slant portions with respect to the move direction are formed at the insertion end portions of the individual sets of support guide portions, any positional shift between the insertion position of the plates and their support position by the individual sets of support guide portions can be corrected, so that reliable, stable storage of the plates into the plate storage device can be implemented. Besides, the formation of such slant portions makes it possible to smooth the insertion and move of the plates along the support guide portions, contributing also to reduction of the amount of generation of the chips.

Also, in the case where the support guide portions are so formed that mutual contact surfaces between the plates and the support guide portions, respectively, are lower in hardness in the support guide portions than in the plates, the amount of generation of chips due to the mutual contact can be reduced.

Also, in the case where, conversely, the plates are so formed that hardness in the plates is lower than hardness in the support guide portions, similar effects can be obtained and moreover formation materials for the plate housing to which generality is demanded can be maintained as those of standard specifications.

BRIEF DESCRIPTION OF DRAWINGS

These and other aspects and features of the present invention will become clear from the following description taken in conjunction with the preferred embodiments thereof with reference to the accompanying drawings, in which:

FIG. 23A is a side view of a recess portion of the magazine cassette;

FIG. 23B is a front view of the recess portion of the magazine cassette;

Figure 1:
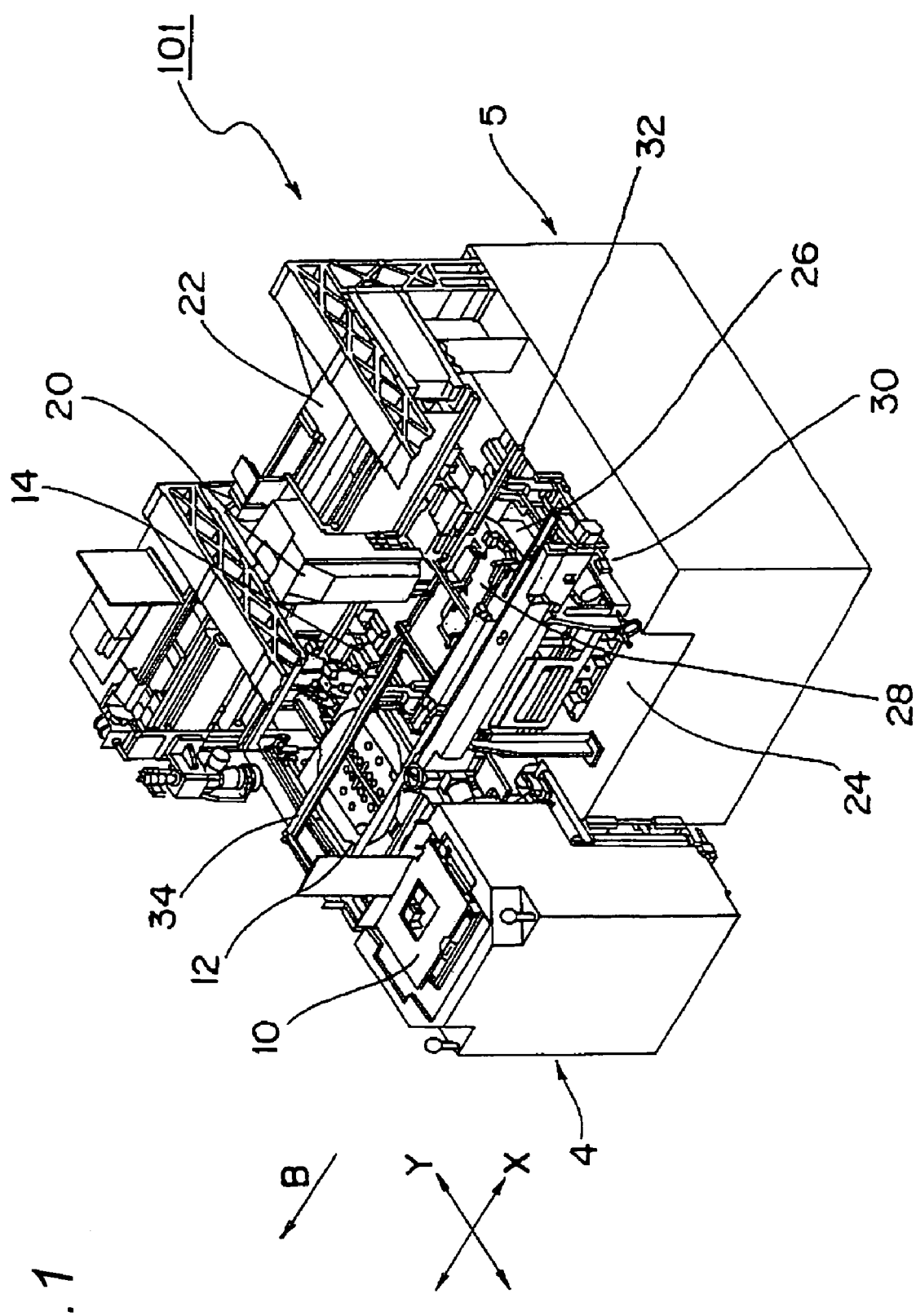
FIG. 1 is a perspective view of an electronic component mounting apparatus according to a first embodiment of the present invention.

REFERENCE NUMERAL 2 electronic component
2w wafer feed component
2t tray feed component
4 component feeder
5 mounting apparatus
6 plate 6w wafer feed plate
6t tray feed plate
7 wafer
8 wafer sheet
9 wafer ring
10 lifter device
12 plate placement device
40 plate moving device
50 magazine cassette
51 cassette up/down unit
52 base
57 component feed tray
58 tray placement portion
59 tray ring
101 electronic component mounting apparatus
114, 124, 134 identification mark portion
C plate extraction direction

DETAILED DESCRIPTION OF THE INVENTION

Before the description of the present invention proceeds, it is to be noted that like parts are designated by like reference numerals throughout the accompanying drawings.

Hereinbelow, embodiments of the present invention will be described in detail with reference to the accompanying drawings.

First Embodiment

FIG. 1 shows a perspective view of an electronic component mounting apparatus 101 as an example of a component mounting apparatus which includes a component feeder 4 as an example of a component feeder according to a first embodiment of the present invention, and which serves for mounting components fed from the component feeder 4 onto a board. Before the description on detailed structures and operations of the component feeder 4 proceeds, the general construction and operation of the electronic component mounting apparatus 101 including such a component feeder 4 are described with reference to FIG. 1.

(Electronic Component Mounting Apparatus)

As shown in FIG. 1, the electronic component mounting apparatus 101 is an apparatus for performing mounting operation by which an electronic component 2, such as a chip component and a bare IC chip, is mounted on a board. The electronic component mounting apparatus 101 includes a component feeder 4 for feedably housing therein a plurality of electronic components 2, and a mounting apparatus 5 for performing mounting operation by which each electronic component 2 fed from the component feeder 4 is mounted on a board.

In the component feeder 4 shown in FIG. 1, a lifter device 10 is installed on the fore side of the component feeder 4 in a Y-axis direction in the figure, the lifter device 10 being an example of a plate storage device on which wafer feed plates and tray feed plates are compositely placed so that individual plates can be selectively fed, where the wafer feed plates each serve for placing thereon a wafer on top of which a plurality of wafer feed components 2w (an example of components) out of a multiplicity of electronic components 2 to be mounted on the board are placed, and where the tray feed plates each serve for placing thereon a plurality of component feed trays on top of each of which tray feed components 2t (an example of components) out of the multiplicity of electronic component 2 are housed and placed as they are arrayed in a grid shape. It is noted that, in the following description, when limited use of either the wafer feed plate or the tray feed plate is unintended, the term "plates" (an example of component feed plates) is used, and that when limited use of either the wafer feed components 2w or the tray feed components 2t is unintended, the term "electronic components 2" (an example of components) is used. In addition, the structure of the individual plates or the like will be described later. Also, the wafer feed components 2w include bare IC chips or the like formed mostly by dicing of wafers, and the tray feed components 2t includes the bare IC chips and IC chips (e.g., packaged IC chips etc.), chip components or the like other than the bare IC chips.

The component feeder 4 includes a plate placement device 12 for placing thereon the individual plates selectively fed from the lifter device 10 so that the electronic component 2 can be extracted from the individual plates. It is noted that when the wafer feed plates are fed from the lifter device 10 so as to be placed on the plate placement device 12, the wafer placed on the wafer feed plate is subjected to an expanding operation in the plate placement device 12.

The component feeder 4 further includes an inversion head unit 14 which sucks and holds electronic components 2 one by one from the wafer or the component feed tray placed on the plate selectively set on the plate placement device 12 and further moves the electronic component 2 toward the mounting apparatus 5 along an X direction in the figure, and which vertically inverts the sucked-and-held electronic component 2. In addition, instead of the case where such an inversion head unit 14 is included in the component feeder 4, the inversion head unit 14 may be included in the electronic component mounting apparatus 101 together with the component feeder 4 as a unit provided independently of the component feeder 4.

Also, as shown in FIG. 1, the mounting apparatus 5 includes a mounting head unit 20 for sucking and holding the electronic component 2 and mounting the component on the board. The mounting apparatus 5 further includes an X-axis robot 22 which is an example of the moving unit for supporting and moving back and forth, along an X-axis direction in the figure, the mounting head unit 20 between two positions both placed along the X-axis direction, i.e., a component feed position where the electronic component 2 held by the inversion head unit 14 can be delivered to the mounting head unit 20 and a board mounting area where the mounting operation of the electronic component 2 onto the board is carried out.

The mounting head unit 20 includes a holding part (not shown) which can be driven to move up/down by moving means such as voice coil motor or the like and moreover which is enabled to impart junction energy, such as pressing energy or ultrasonic vibration energy or thermal energy, to the electronic component 2 and the junction portion of the board via the sucked-and-held electronic component 2, where the junction energy can be imparted thereto while the electronic component 2 is being pressed against the board. The X-axis robot 22 includes a moving mechanism (not shown) using a ball screw shaft and a nut screwed with the ball screw shaft as an example.

Also, as shown in FIG. 1, on a base 24 of the mounting apparatus 5 below the mounting head unit 20 and the X-axis robot 22 is provided an X-Y table 26 which can move the board in the X-axis and Y-axis directions in the figure and which performs determination of a position at which the electronic component 2 is mounted on the board relative to the mounting head unit 20. The X-Y table 26 can be driven into motion, for example, by a servomotor in the X-axis and Y-axis directions, respectively, in the figure, and also can be positioned by full-close control with a linear scale. Further, on a top face of the X-Y table 26 is installed a board holding table 28 for releasably holding and fixing the board. In addition, in FIG. 1, the X-axis and Y-axis directions are directions extending along the board surface and orthogonal to each other.

The electronic component mounting apparatus 101, as shown in FIG. 1, also includes, at an end portion on the top face of the base 24 on the fore side in the Y-axis direction in the figure, a board conveyance unit 30 which conveys a board along a board conveyance direction B, i.e. a direction extending leftward in the X-axis direction in the figure, to perform feed of the board to the board holding table 28 and discharge of the board from the board holding table 28. The board conveyance unit 30 includes a loader 32 which is an example of a loader unit for conveying and feeding a board from an right-side end portion of the electronic component mounting apparatus 101 in the X-axis direction in the figure to the board holding table 28 on the X-Y table 26, and an unloader 34 which is an example of an unloader unit for conveyed and discharging the board from the board holding table 28 to the left-side end portion of the electronic component mounting apparatus 101 in the X-axis direction in the figure. It is noted that this embodiment is a case in which the X-Y table 26 in the electronic component mounting apparatus 101 is used also as a board holding and moving unit included in the board conveyance unit 30. Also, the X-Y table 26 and the board holding table 28 are an example of the board holding and moving unit for performing move and hold of the board. In addition, instead of such a case of shared use, the board holding and moving unit may be included in the board conveyance unit 30 independently of the X-Y table 26 in the electronic component mounting apparatus 101.

It is noted that the electronic component mounting apparatus 101 is shown in FIG. 1 by a perspective view of its one state in which a casing cover that covers the entire top face of the base 24 has been removed for explanation's sake of the structure.

Next, mounting operation of the electronic component 2 onto the board by the electronic component mounting apparatus 101 having the construction shown above is explained.

Referring to the electronic component mounting apparatus 101 of FIG. 1, the board holding table 28 is moved by the X-Y table 26 so as to be located between the loader 32 and the unloader 34 on the base 24. Along with this, a board on which respective electronic components 2 are to be mounted by the electronic component mounting apparatus 101 is fed, for example, from a unit adjacent to the electronic component mounting apparatus 101 to the loader 32 of the board conveyance unit 30, and the board is conveyed in the board conveyance direction B by the loader 32, and further the board is fed to and held on the board holding table 28. Thereafter, the X-Y table 26 is moved in the X-axis direction or the Y-axis direction in the figure, so that the board is moved to the board mounting area.

Meanwhile, by the component feeder 4, one plate is selected and extracted out of the plates stored in the lifter device 10, and placed on the plate placement device 12. Then, the electronic component 2 is sucked and held and further extracted from the above-placed plate by the inversion head unit 14, and the electronic component 2 is inverted and moved to the component feed position. Further, in the mounting apparatus 5, the mounting head unit 20 is moved to the component feed position by the X-axis robot 22, where the electronic component 2 is delivered from the inversion head unit 14 to the mounting head unit 20. Thereafter, the mounting head unit 20, which is sucking and holding the delivered electronic component 2, is moved to above the board mounting area by the X-axis robot 22.

Then, alignment between the electronic component 2 sucked and held by the mounting head unit 20 and a position in the board held by the board holding table 28 where the electronic component 3 is to be mounted is performed by move of the X-Y table 26. After this alignment, up/down operation or the like of the mounting head unit 20 is performed, by which the mounting operation of the electronic component 2 onto the board is achieved. In a case where this mounting operation is performed for a plurality of electronic components 2, the above individual operations are iteratively performed, by which mounting operation for each electronic component 2 is achieved.

After that, upon an end of the mounting operation for the individual electronic components 2, the board on which the electronic components 2 have been mounted is moved by the X-Y table 26 along with the board holding table 28 to the position between the loader 32 and the unloader 34, where the board is delivered from the board holding table 28 to the unloader 34, the board being then conveyed along the board conveyance direction B by the unloader 34 so as to be discharged out from the electronic component mounting apparatus 101. The discharged board is, for example, fed to another device for performing process subsequent to the component mounting or the like installed in adjacency to the electronic component mounting apparatus 101, or stored as a component-mounted board in a board storage unit or the like.

In this way, in the electronic component mounting apparatus 101, mounting operation of the individual electronic components 2 onto the board is carried out. In addition, after the board with the individual electronic components 2 mounted thereon is discharged from the unloader 34, another new board is fed from the loader 32, so that the mounting of individual electronic components 2 onto boards that are fed one after another is carried out.

(Component Feeder)

Figure 2:
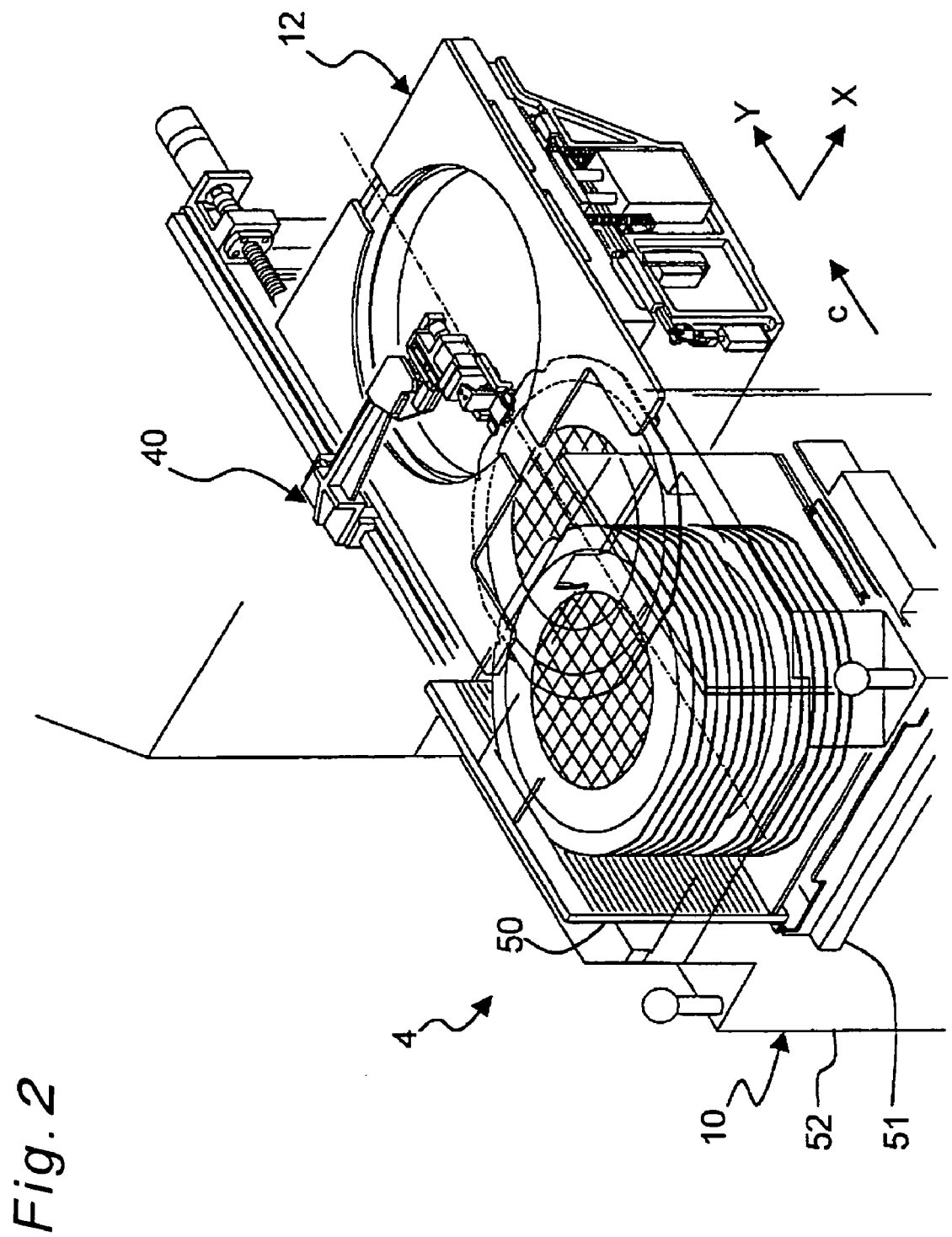
FIG. 2 is an enlarged semitransparent perspective view of a component feeder included in the electronic component mounting apparatus of FIG. 1.

Next, the component feeder 4 included in the electronic component mounting apparatus 101 that has the construction and performs the component mounting operation as described above is described with respect to its detailed construction, particularly about the construction of the lifter device 10, the plate placement device 12 and members associated with those. FIG. 2 shows a semitransparent perspective view of the component lifter device 10 and the plate placement device 12 in the component feeder 4 shown above.

As shown in FIG. 2, the component feeder 4 further includes, in addition to the above-described lifter device 10 and plate placement device 12, a plate moving device 40 for holding and extracting each of the plates stored in the lifter device 10, and moving the plate so as to set the plate on the plate placement device 12. The plate moving device 40 is also enabled to hold and move a plate placed on the plate placement device 12 so as to make the plate stored again on the lifter device 10.

First, the lifter device 10 includes a magazine cassette 50 which is an example of the receiver for component feed plates (or plate receiving unit) having a box-like configuration for storing therein a plurality of the wafer feed plates and a plurality of the tray feed plates as these plates are compositely placed so as to be housed in multiple vertically stacked-up layers, a cassette up/down unit 51 which is an example of a storage member up/down part for supporting the magazine cassette 50 and moreover performing up/down operation of the magazine cassette 50 so that one plate out of the plates stored in the magazine cassette 50 is positioned at such an up/down height position where the plate can be extracted by the plate moving device 40, and a base 52 on which the cassette up/down unit 51 is mounted and which can guide up/down operation of the magazine cassette 50 by the cassette up/down unit 51.

Figure 3:
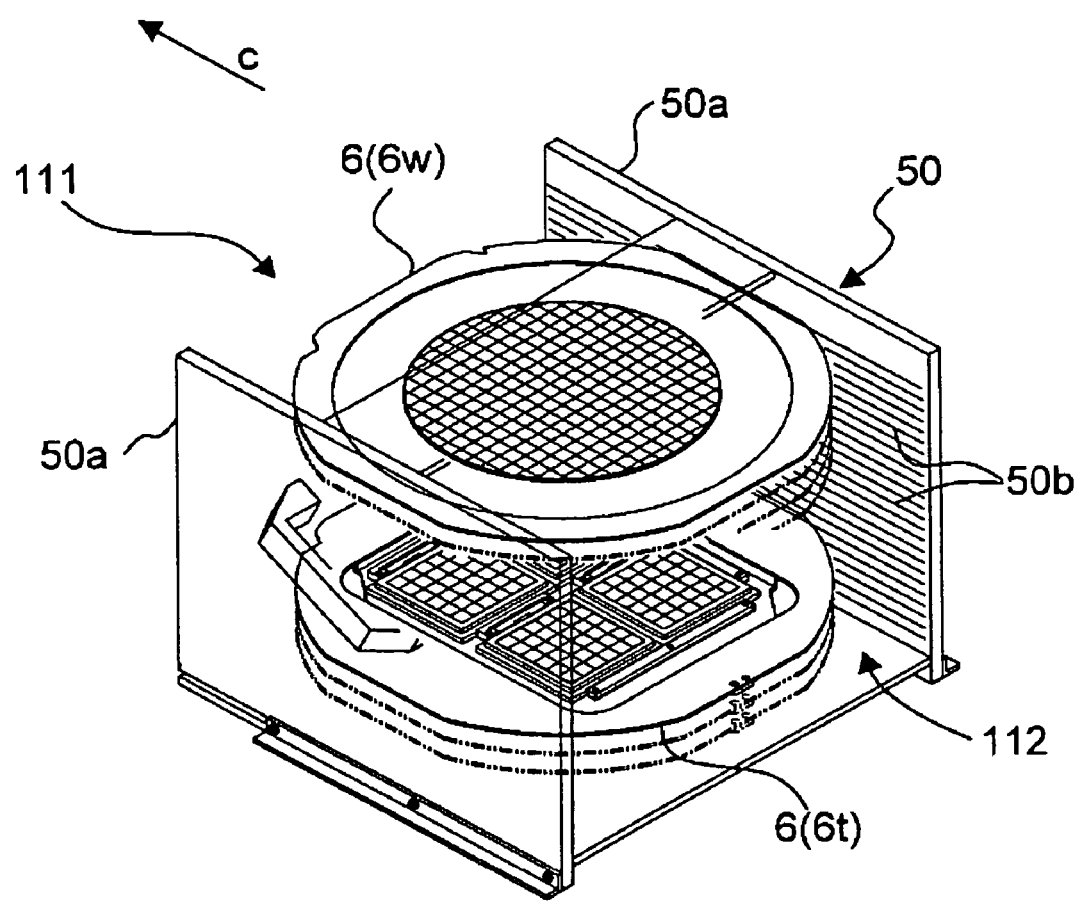
FIG. 3 is a semitransparent perspective view of a magazine cassette in a lifter device of the component feeder.

Now, an enlarged perspective view (semitransparent perspective view) of the magazine cassette 50 is shown in FIG. 3. As shown in FIG. 3, for the magazine cassette 50, a direction C in the figure is a direction in which the individual plates are extracted toward the plate placement device 12 (hereinafter, the direction will be referred to as plate extraction direction C). Also, in the magazine cassette 50, side wall portions 50*a* are provided so as to be perpendicular to the plate extraction direction C and opposed to each other, and a plurality of recess portions 50*b* are formed in the mutually opposing side faces of the side wall portions 50*a* along the plate extraction direction. The plates (hereinafter, referred to each as plates 6) are held and stored in the magazine cassette 50 by having their mutually opposing both end portions engaged with the recess portions 50*b* of the individual side wall portions 50*a*. It is noted that the individual recess portions 50*b* of the side wall portions 50*a* are formed at a regular interval pitch in each side wall portion 50*a*, and the plates 6 are held in engagement with the individual recess portions 50*b* with the surfaces of the plates 6 generally horizontal. Further, the plates 6 are movable back and forth (i.e., movable in sliding) along the plate extraction direction while being guided along the direction in which the individual recess portions 50*b* are formed. In the magazine cassette 50, in which the stored individual plates 6 are extracted, there are provided no side wall portions on the sides of the plate extraction direction C so as not to give any obstacle for the extraction but to provide a normally opened state. It is noted that in FIG. 3, a plate 6 stored upward in the figure is a wafer feed plate 6*w*, and a plate 6 stored downward is a tray feed plate 6*t*.

Figure 5:
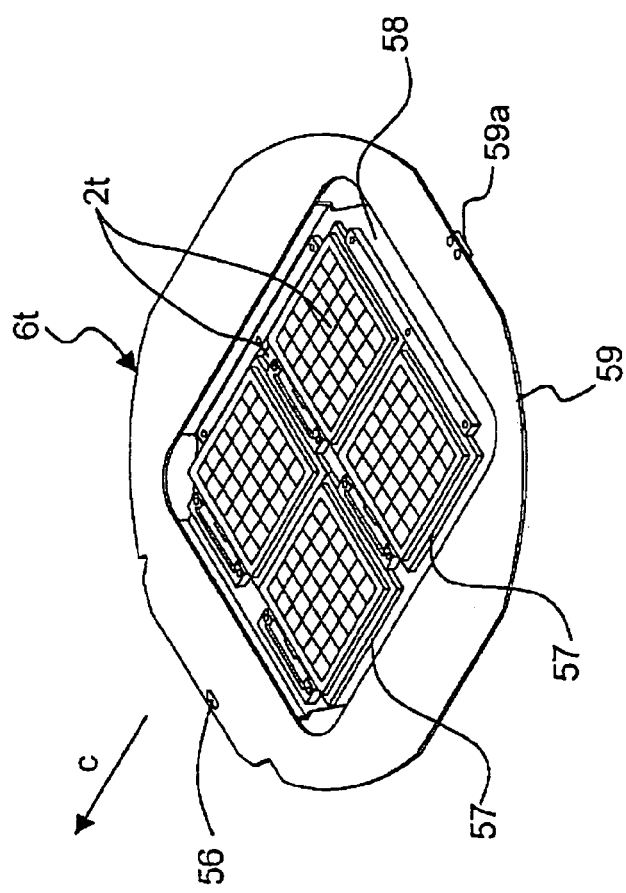
FIG. 5 is a perspective view of a tray feed plate treated by the component feeder.
Figure 4:
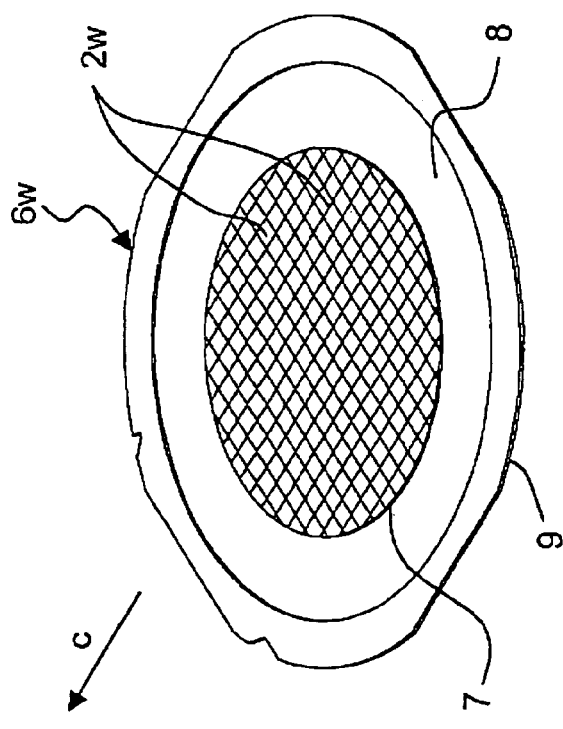
FIG. 4 is a perspective view of a wafer feed plate treated by the component feeder.

Next, with reference to FIG. 4, which shows a perspective view of the wafer feed plate 6*w*, and FIG. 5, which shows a perspective view of the tray feed plate 6*t*, structures of the individual plates are explained.

As shown in FIG. 4, the wafer feed plate 6*w* has a generally disc-shaped configuration having an outer peripheral portion formed of linear portions and curved portions in combination. End portions of the wafer feed plate 6*w* opposed to each other across the plate extraction direction C are formed into the linear peripheral portions in consideration of being engaged the individual recess portions 50*b* of the magazine cassette 50. Also as shown in FIG. 4, the wafer feed plate 6*w*, which is an expandable-and-contractible sheet, includes a wafer sheet 8 having a diced wafer 7 bonded and placed on its top face, and a wafer ring 9 which is an annular plate and which holds the wafer sheet 8 in proximity to its outer-peripheral end portion so that the wafer 7 is positioned inside the annular shape. With such formation of the wafer feed plate 6*w*, placement positions of the wafer feed components 2*w* placed in a grid shape can also be radially expanded by radially expanding the wafer sheet 8, thus making the expansion achievable.

Meanwhile, as shown in FIG. 5, the tray feed plate 6*t* has an outer-diameter configuration similar to that of the wafer feed plate 6*w* described above. As a result of this, it is practicable to compositely place and store the wafer feed plate 6*w* and the tray feed plate 6*t* in a common magazine cassette 50. Further, as shown in FIG. 5, the tray feed plate 6*t* includes a tray ring 59 which is an annular plate having an outer peripheral configuration generally similar to that of the wafer ring 9 and having a generally square-shaped inner peripheral hole portion, and a tray placement portion 58 which is formed so as to be fitted at the inner peripheral hole portion of the tray ring 59 and which is to have a plurality of component feed trays 57 removable placed thereon. The tray placement portion 58 is so formed as to be one-step lower than the surface of the tray ring 59, so that with the component feed trays 57 placed thereon, the height position of the top face of each of the tray feed components 2*t* stored in the component feed trays 57 becomes generally equal to the height position of the surface of the tray ring 59. As a result of this formation, the height position of the tray feed components 2*t* in the tray feed plate 6*t* is made generally equal to the height position of the wafer feed components 2*w* in the wafer feed plate 6*w*. In addition, in FIG. 5, four component feed trays 57 each having a generally square-shaped planar configuration are placed in the tray placement portion 58 so as to be arrayed in two rows. Furthermore, instead of the case where the tray placement portion 58 is formed independently of the tray ring 59 and fitted inside the tray ring 59, the tray placement portion 58 may be formed integrally with the tray ring 59. Also, as shown in FIG. 5, the position where the tray feed plate 6*t* is held by the plate moving device 40 is given by an end-portion proximate position of the tray ring 59 in the tray feed plate 6*t* on the plate extraction direction C side, and an identification hole 56 for identifying the tray feed plate 6*t* is formed at the aforementioned portion. Further, this portion serves as the holding position also in the wafer feed plate 6*w* of FIG. 4, but the identification hole 56 for the identification use is not provided. As will be described later, the difference in the presence or absence of the identification hole 56 allows the tray feed plate 6*t* and the wafer feed plate 6*w* to be distinguished therebetween.

Figure 6:
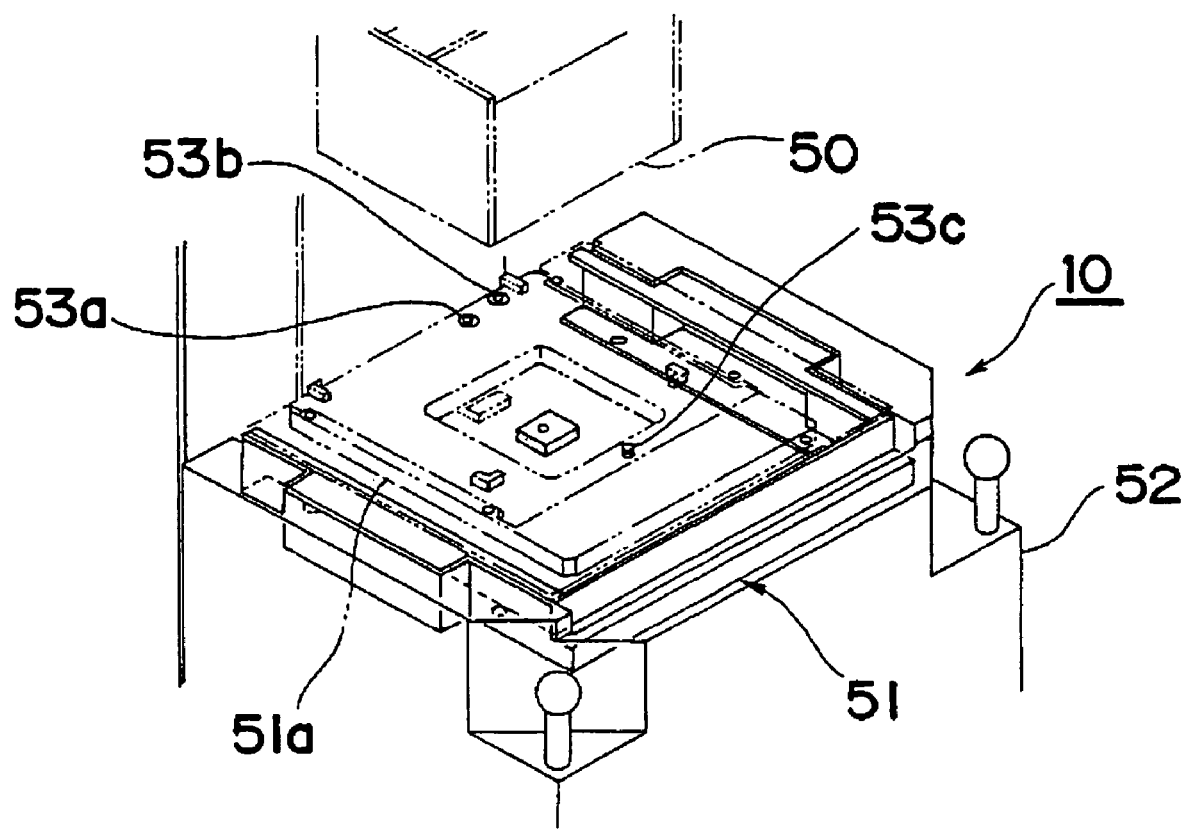
FIG. 6 is a perspective view of a cassette up/down unit in the lifter device.

Further, as shown in FIG. 6, the cassette up/down unit 51 in the lifter device 10 includes a cassette support table 51*a* for placing thereon and holding the magazine cassette 50 on its top face. The magazine cassette 50 treated by the lifter device 10 in this case comes in a plurality of kinds of sizes, for example, those of 6-inch, 8-inch or 12-inch sizes. For detection of size differences among those individual magazine cassettes 50, a 6-inch cassette detection sensor 53*a*, an 8-inch cassette detection sensor 53*b* and a 12-inch cassette detection sensor 53*c* capable of detecting differences in planar size among those magazine cassettes to detect the size of a set magazine cassette 50 are provided on the top face of the cassette support table 51*a*.

Figure 7:
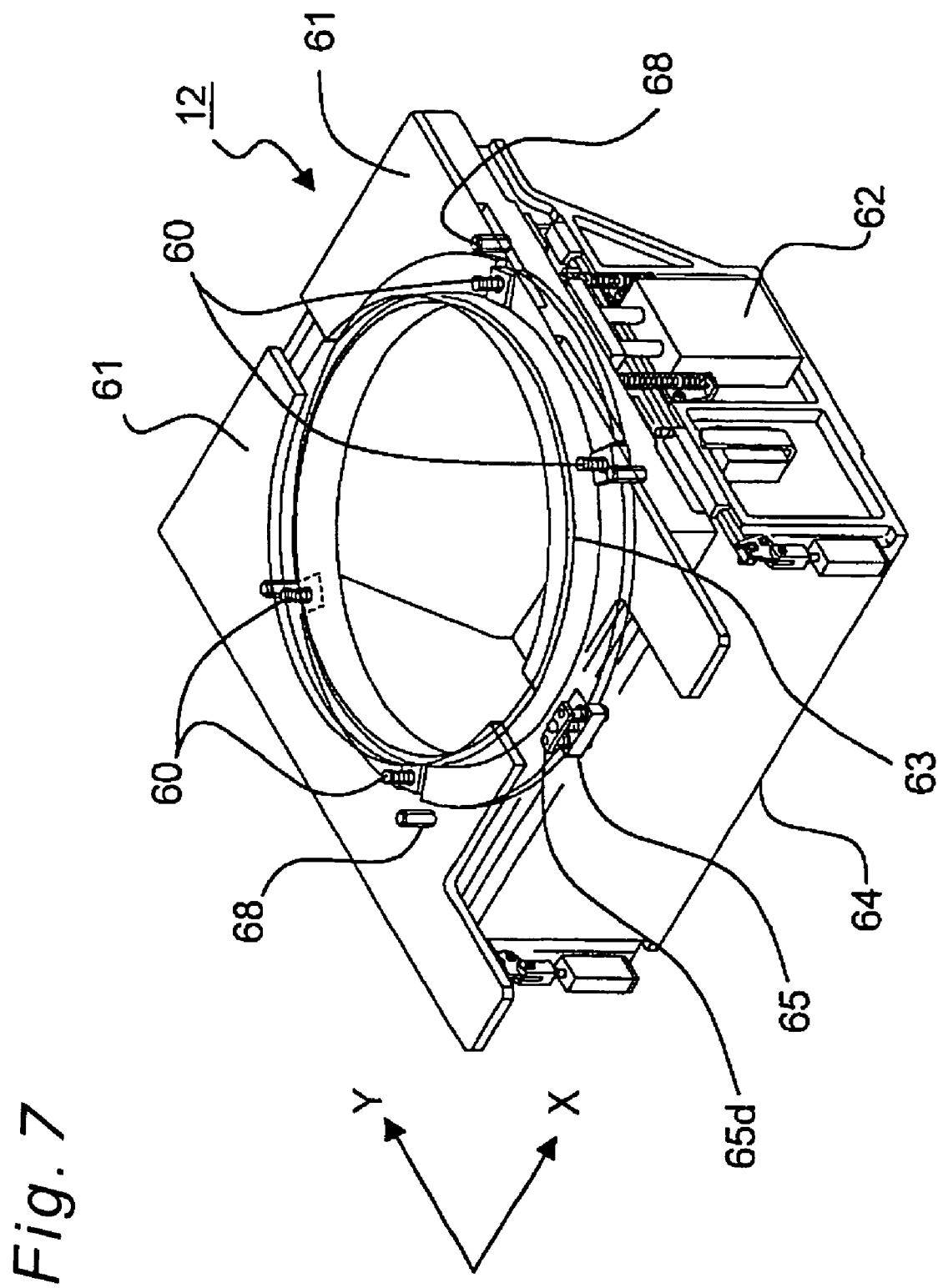
FIG. 7 is a perspective view of a plate placement device of the component feeder.

Next, FIG. 7 shows a semitransparent perspective view of the plate placement device 12. As shown in FIG. 7, the plate placement device 12 includes plate support portions 60 as an example of a plurality of elastic support members which are capable of supporting a set plate 6 on its lower face side in proximities to its outer peripheral portion and which are variable in their support height positions, plate presser members 61 for pressing the plate 6 supported by the plate support portions 60 on their top-face side at proximities to its outer peripheral portion so as to pinch the plate 6 in cooperation with upper ends of the individual plate support portions 60 so that the support position of the plate 6 is held, and a presser member up/down part 62 for performing up/down operation of the plate presser members 61.

Also, as shown in FIG. 7, the plate presser members 61 are a pair of plate-shaped members which have semicircular cutout portions and which have symmetrical configurations placed so that their cutout portions are opposed to each other in one identical plane. Also, since the semicircular cutout portions are formed as shown above, the individual plate presser members 61 are enabled to make their lower faces brought into contact with and thereby press only the top face of the wafer ring 9 of the wafer feed plate 6*w*, and moreover to make their lower faces brought into contact with and thereby press only the top face of the tray ring 59 of the tray feed plate 6*t*. Further, in the plate placement device 12, for example, four plate support portions 60 are provided, and the individual plate support portions 60 are placed under the portions of the plate presser members 61 where the wafer ring 9 or the tray ring 59 is pressed. Thus, it is made possible to support the wafer ring 9 or the tray ring 59 on their lower face side by the individual plate support portions 60. In addition, it is desirable that the individual plate support portions 60 be placed at generally equal intervals along the outer periphery of the wafer ring 9 or the tray ring 59 placed upward of the plate support portions 60. Also, as shown in FIG. 7, the plate placement device 12 includes a taper support portion 65 as an example of another elastic support member which has a tapered slant end portion at its upper-end side fore end portion on the left side in the Y-axis direction in the figure in proximities to the circumference on which the individual plate support portions 60 are placed, where an end portion of the plate 6 is to be brought into contact with the slant end portion.

Further, the plate placement device 12 includes an expanding member 63 which has, at its upper end, an annular contact portion that can be brought into contact with the lower face of the wafer sheet 8 between the outer periphery of the wafer 7 and the inner periphery of the wafer ring 9 in the case of a wafer feed plate 6w in which the wafer ring 9 is supported by the individual plate support portions 60, and a placement frame 64 for fixing and supporting the expanding member 63 on its top face. It is noted that in the plate placement device 12, two presser member up/down parts 62 are provided and mounted on the placement frame 64, where the presser member up/down parts 62 are fitted to side faces, respectively, of the placement frame 64 in the X-axis direction as viewed in FIG. 7. Further, up/down operation of the plate presser members 61 is integrally performed from the individual presser member up/down parts 62.

Figure 8:
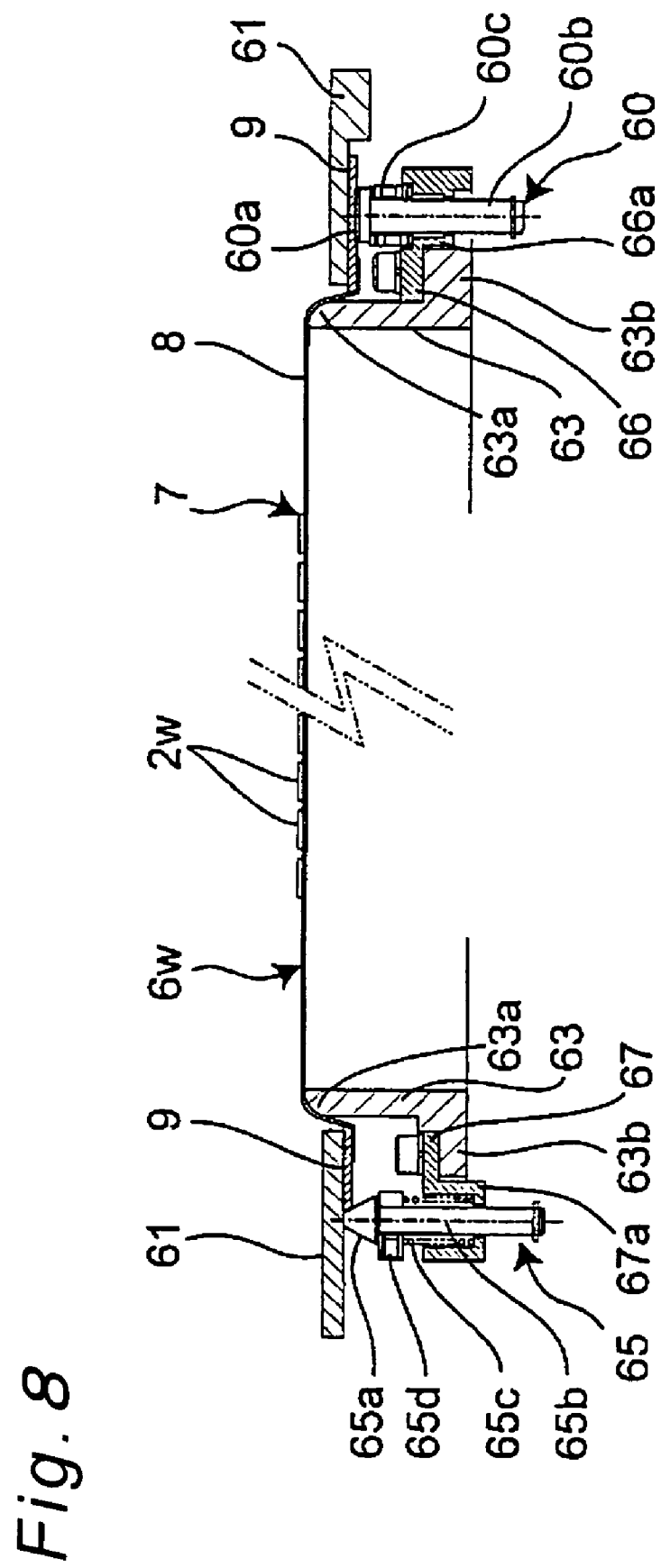
FIG. 8 is a sectional view in a state that the wafer feed plate is placed on the plate placement device.
Figure 9:
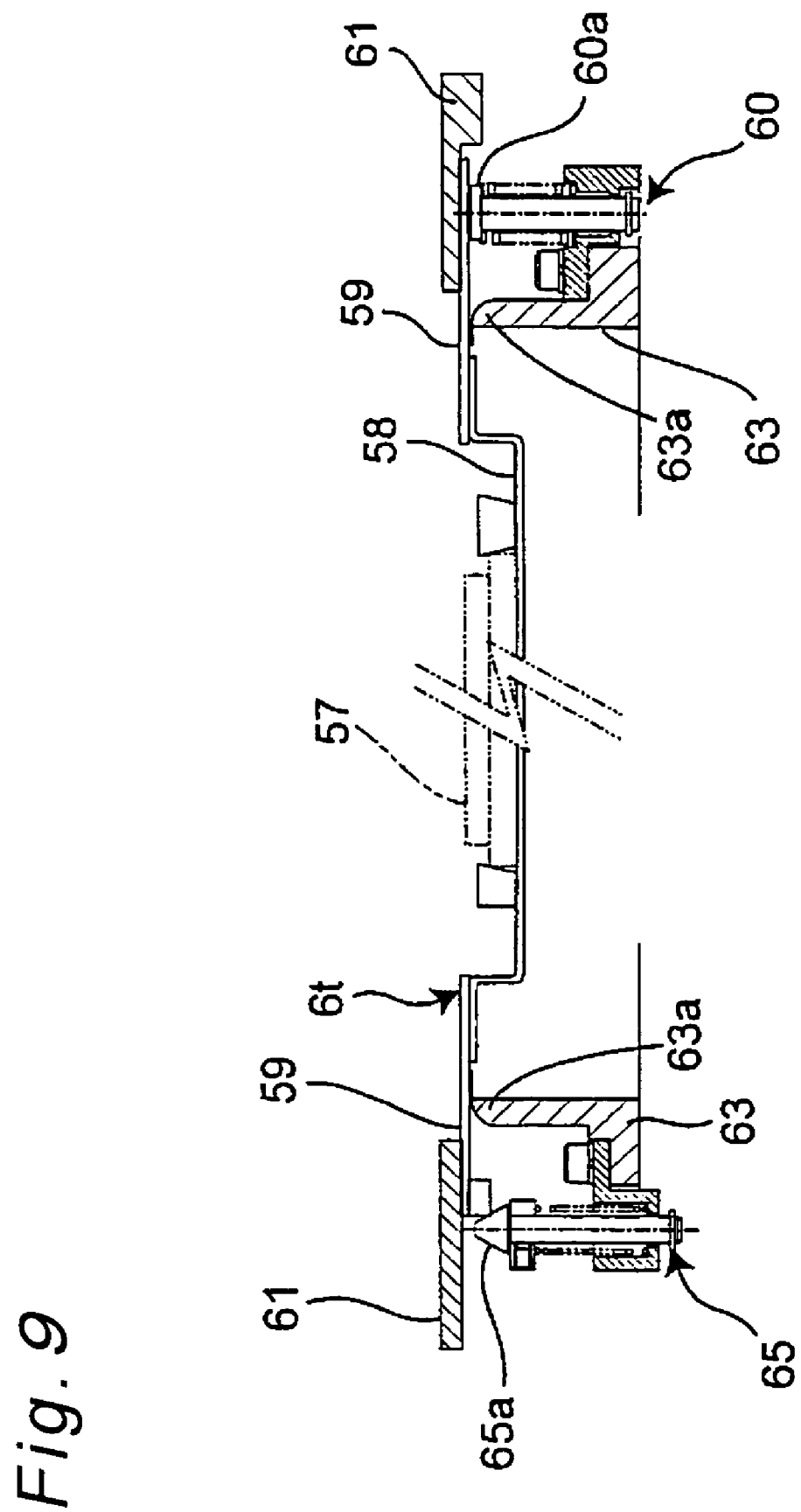
FIG. 9 is a sectional view in a state that the tray feed plate is placed on the plate placement device.

Next, FIG. 8 shows an enlarged sectional view of a placement portion where the wafer feed plate 6w is placed on the plate placement device 12 of the above-described construction. FIG. 9 shows an enlarged sectional view of a placement portion where the tray feed plate 6t is placed on the plate placement device 12.

First, as shown in FIG. 8, the expanding member 63 having an annular configuration includes a flange portion 63b formed at a lower portion so as to be directed toward the outer periphery, and the plate support portion 60 and the taper support portion 65 are up/down movably mounted on the flange portion 63b. The plate support portion 60 includes a shaft-like support pin 60b having a flat-shaped or gently-bumped support end portion 60a at its upper end portion, and a biasing spring 60c which is placed on the outer periphery of the support pin 60b so as to normally upwardly bias the support pin 60b against the flange portion 63b. It is noted that an upper-limit position for the upward biasing of support pin 60b by the biasing spring 60c is mechanically limited. Also, in FIG. 8, the plate support portion 60 is fitted to the flange portion 63b of the expanding member 63 by means of a fitting member 66, so that the support pin 60b can be guided to be moved up and down along the inner peripheral surface of a pin hole 66a formed in the fitting member 66. Accordingly, downwardly applying an external force to the support end portion 60a causes the biasing spring 60c to be contracted so that the support pin 60b is moved down along the inner peripheral surface of the pin hole 66a, while weakening or releasing the external force causes contracted biasing spring 60c to be expanded so that the support pin 60b is moved up along the inner peripheral surface of the pin hole 66a.

Also, the taper support portion 65, which also has a mechanism based on a concept similar to that of the plate support portions 60 except for the configuration of its upper end portion, includes a support pin 65b, a biasing spring 65c, a fitting member 67 and a pin hole 67a as shown in FIGS. 7 and 8. Also, the upper end portion is formed into a slant end portion 65a having a tapered configuration, so that keeping an outer-peripheral end portion of the wafer ring 9 in contact with the slant surface of the slant end portion 65a makes it possible to hold the support position in the direction extending along the surface of the wafer ring 9 by making use of an angular resistance of the slant surface. In addition, as shown in FIGS. 7 and 8, the taper support portion 65 has a guide portion 65d for guiding up/down move of the support pin 65b. Also, as shown in FIG. 8, an annular fore end portion 63a is formed at an upper portion of the expanding member 63, and the fore end portion 63a can be brought into contact with the lower face of the wafer sheet 8 between the outer peripheral portion of the wafer 7 and the inner peripheral portion of the wafer ring 9.

In the construction as shown above, when the wafer ring 9 that is sandwiched and supported between the lower faces of the plate presser members 61 and the plate support portions 60 is moved down by down operation of the plate presser members 61 exerted by the presser member up/down parts 62, the wafer sheet 8 can be radially expanded along with the down motion of the wafer ring 9 with the contact position serving as a fulcrum while the fore end portion 63a of the expanding member 63 is kept in contact with the lower face of the wafer sheet 8. As a result of this, placement positions of the individual wafer feed components 2w bonded on the top face of the wafer sheet 8 are also expanded radially, by which the so-called expansion of the wafer 7 can be achieved. In addition, as shown in FIG. 7, on the top face of the placement frame 64 below the individual plate presser members 61 are fitted a plurality of expansion lower-limit stoppers 68 which, when coming into contact with the lower faces of the moved-down plate presser members 61, can regulate the lower-limit positions of the down move. By the lower-limit positions being regulated in this way, the expansion range for the wafer sheet 8 in the expanding operation can be regulated.

Next, FIG. 9 shows a state that the tray feed plate 6t is placed on the plate placement device 12 having the construction described above. As shown in FIG. 9, the tray feed plate 6t is supported between each plate presser member 61 and the support end portion 60a of each plate support portion 60 so as to sandwich the tray ring 59. Further, by the outer-peripheral end portion of the tray ring 59 kept in contact with the slant surface of the slant end portion 65a of the taper support portion 65, the support position of the tray ring 59 in the direction extending along its surface is held by the angular resistance. Also, the tray placement portion 58 located at a position one-step lower than the tray ring 59 is placed inside the annular expanding member 63. Moreover, in this holding state of the tray feed plate 6t, between the fore end portion 63a of the expanding member 63 and the lower face of the tray ring 59 located upward, such a gap is ensured that the two members are keep from contact with each other. As a result, it can be prevented that the fore end portion 63a may be damaged due to contact with the tray ring 59. Furthermore, such ensuring of the gap is fulfilled by the move-down position of the plate presser members 61 being restricted by other members. This restriction method is explained with reference to a partly enlarged perspective view of the plate placement device 12 shown in FIG. 10.

Figure 10:
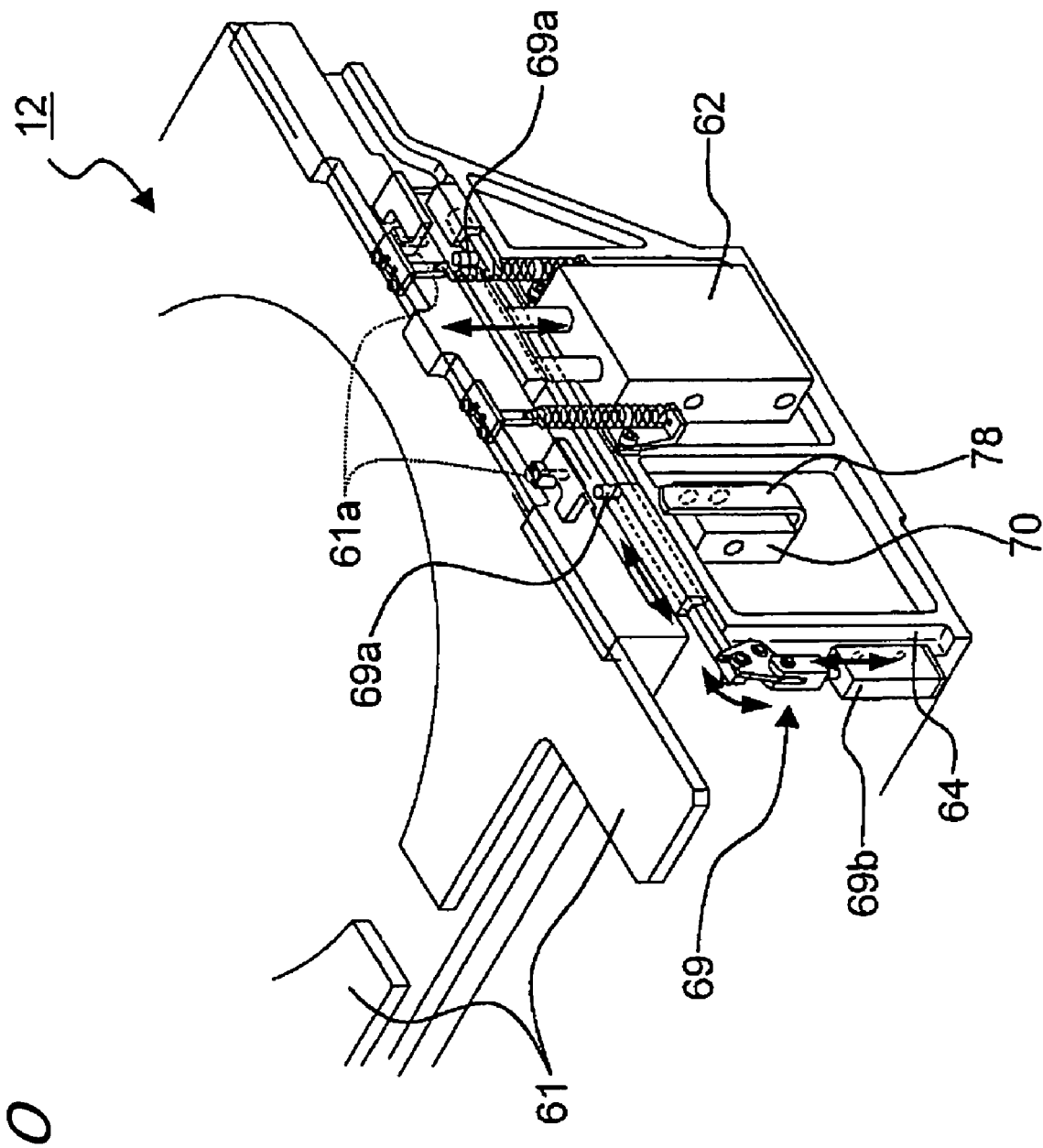
FIG. 10 is a partly enlarged perspective view of the plate placement device.

As shown in FIG. 10, an intermediate stopper drive unit 69 which is an example of a regulation member for regulating the moved-down position of the plate presser members 61 is provided at a proximity to a fore end portion in the top face of the placement frame 64 of the plate placement device 12 as viewed in the figure. This intermediate stopper drive unit 69 includes an intermediate stopper 69a which is an example of a contact portion placed at a proximity to the left-hand fore side end portion in the top face of the placement frame 64 as viewed in the figure, and a stopper moving unit 69b which is an example of a contact portion moving mechanism for moving the intermediate stopper 69a along the end portion. It is noted that the stopper moving unit 69b is composed of, for example, a cylinder which can be driven up and down by supply and exhaust of compressed air, and a link mechanism which is fitted to the cylinder and which mechanically transfers drive of the cylinder to the intermediate stopper 69a. In this connection, a schematic explanatory view for explaining the operation of the intermediate stopper drive unit 69 is shown in FIG. 11.

Figure 11:
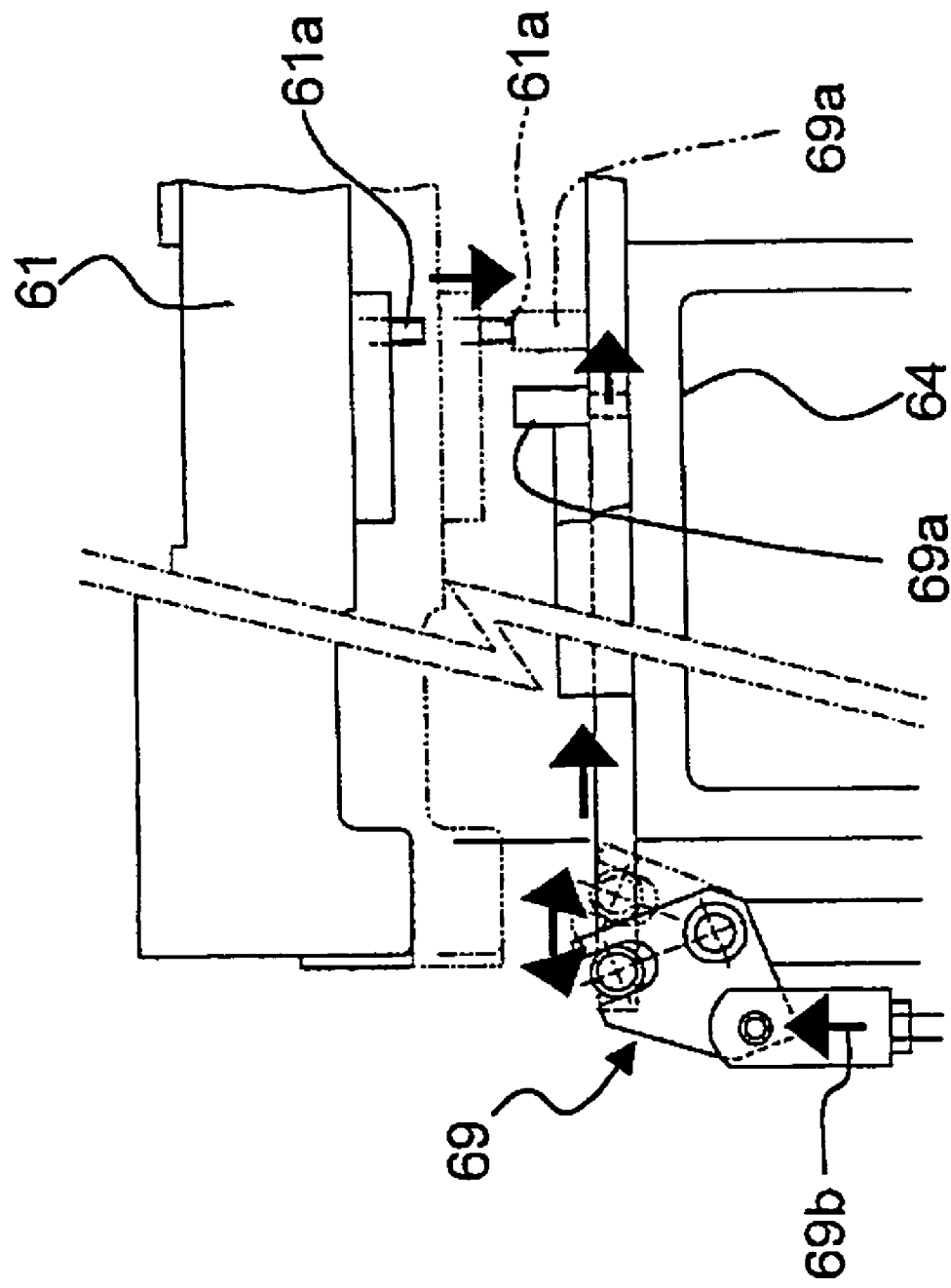
FIG. 11 is a schematic explanatory view of an intermediate stopper drive unit in the plate placement device.

As shown in FIG. 11, a regulation pin 61a is provided at a lower portion of the plate presser member 61. This regulation pin 61a is so placed that its lower end can be brought into contact with an upper end of the intermediate stopper 69a by the down motion of the plate presser member 61. Meanwhile, the stopper moving unit 69b is enabled to move the intermediate stopper 69a back and forth along the top face of the placement frame 64 between a contact position which is a position under the regulation pin 61a and at which the intermediate stopper 69a is contactable with the regulation pin 61a and a retreat position where the intermediate stopper 69a can be kept from contact with the regulation pin 61a even if the regulation pin 61a is moved down. Accordingly, a state of the wafer feed plate 6w shown in FIG. 8 can be achieved by moving down the plate presser members 61 with the intermediate stopper 69a positioned in the retreat position, and a state of the tray feed plate 6t shown in FIG. 9 can be achieved by moving down the plate presser members 61 with the intermediate stopper 69a positioned in the contact position so that the intermediate stopper 69a and the regulation pin 61a are brought into contact with each other to thereby regulate the move-down positions of the plate presser members 61. That is, in the state that the intermediate stopper 69a and the regulation pin 61a kept in contact with each other, a gap is ensured between the tray ring 59 and the fore end portion 63a of the expanding member 63 as shown in FIG. 9. It is noted that in the plate placement device 12, the intermediate stopper drive unit 69 is provided for each of the plate presser members 61 so that the lower-limit positions in the down motions of the plate presser members 61 can be regulated independently, where the intermediate stopper drive units 69 are driven in synchronization with each other.

Figure 12:
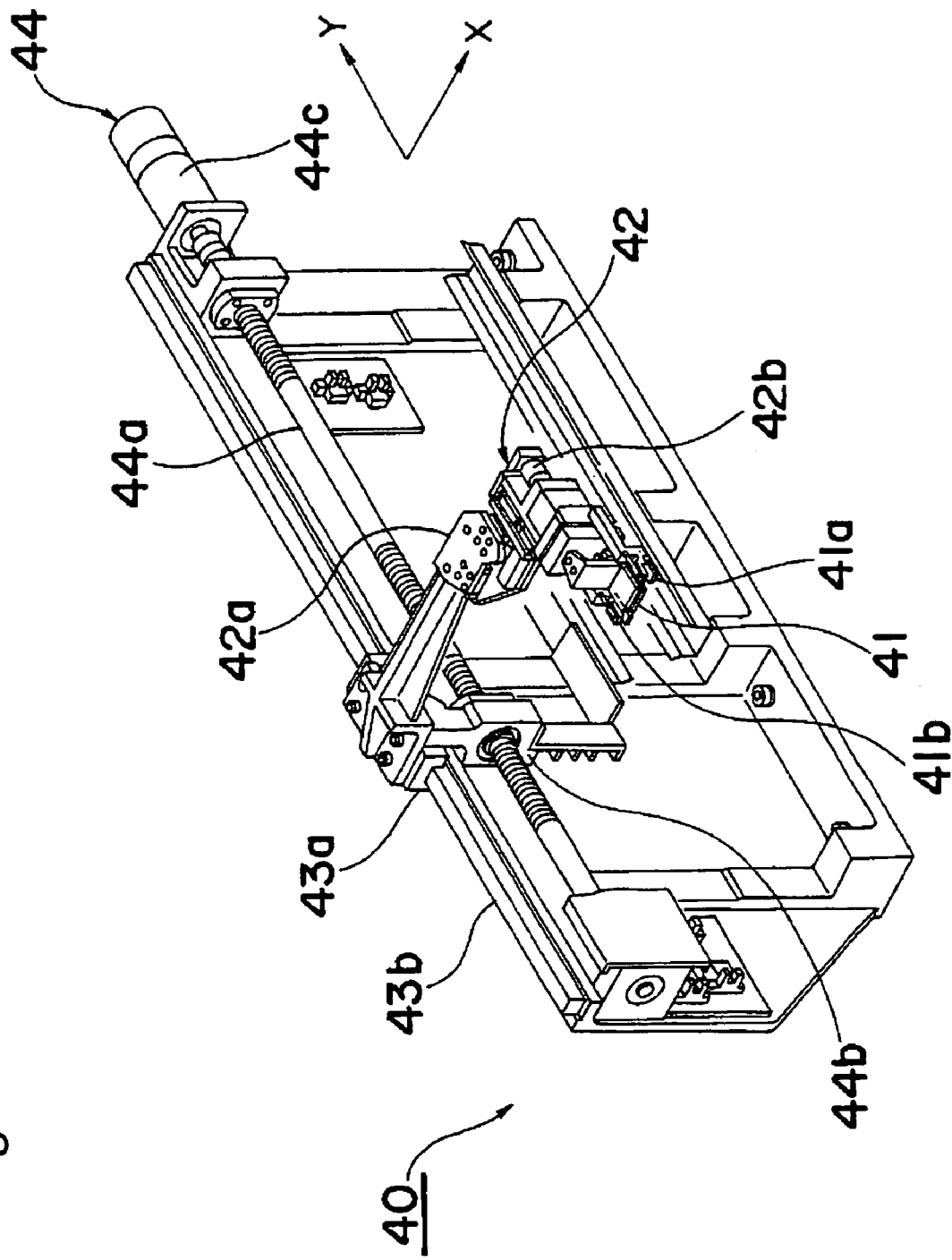
FIG. 12 is a perspective view of a plate moving device in the component feeder.

Next, a perspective view of the plate moving device 40 is shown in FIG. 12. As shown in FIG. 12, the plate moving device 40 includes a chuck 41 which is an example of the holding part for releasably holding the plate 6, an arm mechanism 42 to which the chuck 41 is fitted at its front end and which has a generally L-shaped configuration in a planar view, and a moving unit 44 which is an example of a holding-part moving unit for moving back and forth the arm mechanism 42 in the Y-axis direction in the figure. The moving unit 44 includes a ball screw shaft 44a placed along the Y-axis direction in the figure, a nut 44b screwed with the ball screw shaft 44a, and a moving motor 44c which is fixed to one end of the ball screw shaft and which rotates the ball screw shaft 44a about its axial center to move back and forth the nut 44b in the Y-axis direction in the figure. Also, an end portion of the arm mechanism 42 to which the chuck is not fitted is fixed to an LM block 43a. The LM block 43a is enabled to guide the move of the arm mechanism 42 along an LM rail 43b placed in the Y-axis direction in the figure, where the LM block 43a is fixed to the nut 44b so as to be moved along with the nut 44b, thus allowing the move of the arm mechanism 42.

Further, as shown in FIG. 12, the arm mechanism 42 has a plate distinguishing sensor 41b fitted in adjacency to the chuck 41, the plate distinguishing sensor 41b being an example of a plate distinguishing unit for distinguishing, on a configuration of an end portion of a plate 6, whether the held plate 6 is a wafer feed plate 6w or a tray feed plate 6t. The plate distinguishing sensor 41b performs the discrimination of the plate 6 by distinguishing, by using a transmission sensor, the presence or absence of an identification hole 56 which is not formed in the wafer ring 9 of FIG. 4 but formed in the tray ring 59 of FIG. 5. Also, on one side of the arm mechanism 42 opposite to the side on which the plate distinguishing sensor 41b is provided, a presence-of-plate detection sensor 41a for detecting whether or not the chuck 41 is holding the plate 6 is fitted to the arm mechanism 42 with the chuck 41 interposed therebetween. The presence-of-plate detection sensor 41a detects, with a transmission sensor, the presence or absence of the plate 6 depending on whether or not interception of light of the sensor is detected by an end portion of the wafer ring 9 or the tray ring 59. It is noted that based on a discrimination result by the plate distinguishing sensor 41b, a move position of the intermediate stopper 69a by the intermediate stopper drive unit 69 in the plate placement unit 12 is determined.

Further, as shown in FIG. 12, the arm mechanism 42 includes an X-axis direction centering part 42a for, while mechanically leading the chuck 41 to convergence of its swings in the X-axis direction in the figure, automatically performing centering of its position in the X-axis direction. It is noted that such a centering mechanism is not limited to the X-axis direction in the figure, and may be one which performs centering in the Y-axis direction in the figure. Furthermore, the arm mechanism 42 includes, on a depth side in the Y-axis direction in the figure, a collision detection sensor 42b capable of detecting interference (collision) with any other constituent member. Upon detection of the collision by the collision detection sensor 42b, the moving unit 44 is stopped from moving so as to prevent device failures or damage of the individual electronic components 2 or the like due to the collision.

(Operation of Component Feeder)

Next, operations of the component feeder 4 having the above-described construction are described with respect to the step of extracting the individual plate 6 from the magazine cassette 50 to the step of setting the plate 6 so that the individual electronic components 2 are extractably placed by the plate placement device 12.

First, in FIG. 2, the magazine cassette 50 is moved up or down by the cassette up/down unit 51 of the lifter device 10 so that the plate 6 to be extracted from the magazine cassette 50 is placed at a height position of the chuck 41 of the plate moving device 40. Along with this, the individual plate presser members 61 are moved up to the upper-limit positions of their up/down motions by the presser member up/down parts 62 in the plate placement device 12, and stopped there. When this occurs, a switch part 70a of a mechanical lock valve 70 is pressed by a contact bar 78 so that the switch part 70a is turned to an ON state, where holding-use compressed air is supplied to respective cylinder parts 71 of the presser member up/down parts 62 with the result that the moved-up/down positions of the individual plate presser members 61 are held at the upper-limit positions for their move-up/down.

Next, the arm mechanism 44 is moved leftward in the Y-axis direction as viewed in FIG. 2 by the moving unit 44 in the plate moving device 40, by which the chuck 41 is moved into the magazine cassette 50. Thereafter, when a proximity to the outer-peripheral end portion of the plate 6 to be extracted from the magazine cassette 50 is detected by a presence-of-plate discrimination detection sensor 41*a* which is installed in adjacency to the chuck 41, the outer-peripheral portion proximity is held by the chuck 41. In addition to this, whether the held plate 6 is a wafer feed plate 6*w* or a tray feed plate 6*t* is distinguished by the plate distinguishing sensor 41*b* installed in adjacency to the chuck 41. Thereafter, a rightward move of the arm mechanism 42 in the Y-axis direction in the figure by the moving unit 44 is started, by which the held plate 6 is moved along the recess portions 50*b* of the magazine cassette 50 so as to be extracted.

Then, the plate 6 held by the chuck 41 is moved so as to pass through between the plate presser members 61 and the plate support portions 60 in the plate placement device 12, so that the plate 6 is set to a position where the plate 6 becomes supportable by the plate support portions 60, being stopped there. Thereafter, the plate presser members 61 are moved down by the presser member up/down parts 62, by which the top face of the outer peripheral portion of the plate 6 is pushed downward while the lower face of the outer peripheral portion is brought into contact with the upper ends of the plate support portions 60, by which the plate 6 is held so as to be sandwiched by the plate presser members 61 and the plate support portions 60. Besides, the hold of the plate by the chuck 41 is released, and the arm mechanism 42 is moved rightward in the Y-axis direction in the figure by the moving unit 44 and stopped at a position where interference in planar position between the chuck 41 and the plate 6 is eliminated.

Meanwhile, upon reception of a distinguishing result as to the type of the plate 6 by the plate distinguishing sensor 41*b*, a position to which the intermediate stopper 69*a* is moved by the intermediate stopper drive unit 69 is determined. First, in the case where the plate 6 is the wafer feed plate 6*w*, the intermediate stopper 69*a* is moved to the retreat position, setting a state that the regulation pins 61*a* and the intermediate stoppers 69*a* are retreated from contact with each other. Thereafter, the individual plate presser members 61 are further moved down, causing the individual plate support portions 60 to be pressed down, where the wafer sheet 8 is expanded with the fore end portion 63*a* of the expanding member 63 taken as a fulcrum, thus an expansion being achieved. It is noted that the moved-down plate presser members 61 are put into contact with the expansion lower-limit stoppers 68, respectively, so that the lower-limit position for their down move is regulated, in which state the plate presser members 61 are stopped from being moved down. In such a state, it becomes implementable to extract the wafer feed components 2*w* from the wafer feed plate 6*w*, where the wafer feed components 2*w* are thrust up from below the wafer sheet 8 and the thrust-up wafer feed components 2*w* are held and extracted by the inversion head unit 14, by which the extraction of the wafer feed components 2*w* is fulfilled.

Meanwhile, in the case where the plate 6 is the tray feed plate 6*t*, the intermediate stopper 69*a* is moved to the contact position, setting a state that the regulation pins 61*a* and the intermediate stoppers 69*a* are enabled to make contact with each other. Thereafter, the individual plate presser members 61 are further moved down, causing the individual plate support portions 60 to be pressed down, where the regulation pins 61 and the intermediate stoppers 69*a* are put into contact with each other, respectively, so that the moved-down position of the plate presser members 61 is regulated. In this state, as shown in FIG. 9, a gap is ensured between the lower face of the tray ring 59 and the fore end portion 63*a* of the expanding member 63. Also, in such a state, the down motion of the plate presser members 61 is stopped, so that the tray feed components 2*t* can be extracted from the tray feed plate 6*t*. In this state, by the inversion head unit 14, the tray feed components 2*t* are held and extracted from the component feed trays 57 placed on the tray placement portion 58.

In addition, after the electronic component 2 are extracted from the wafer feed plate 6*w* or the tray feed plate 6*t* as described above, the plate 6 is moved to and stored in the magazine cassette 50 by the plate moving device 40 in a procedure reverse to the above-described one.

(Detailed Structure of Magazine Cassette)

Next, further contrivances in the construction of the magazine cassette 50, in which the individual plates 6 are housed in stacked-up stages, in the component feeder 4 described above are described below.

In such a magazine cassette 50, as described above, a plurality of plates 6 (wafer feed plates 6*w* or tray feed plates 6*t*) are to be extractably housed while being supported by paired sets of recess portions 50*b* so as to be kept in a generally support posture. Meanwhile, in such a magazine cassette 50, the interval pitch at which the recess portions 50*b* are formed in each side wall portion 50*a* is made as small as possible in order to enhance the housing efficiency for the plates 6 and achieve an efficient component feed. Only with a narrowed interval pitch for formation of the recess portions 50*b*, there may occur errors in the housing work for the plates 6 by the operator, i.e., in the work of making the plates 6 housed into the magazine cassette 50, such as a case in which the housed plate 6 is supported by another recess portion 50*b* other than the paired set of recess portions (i.e., a skewed housing state). Moreover, there can occur a problem that even in such a case as described above, it is difficult for the operator to recognize that the support posture is in the skewed housing state. Contrivances for prevention of occurrence of such problems are described below.

First, as shown in FIGS. 2 and 3, in the magazine cassette 50, opening portions are formed in directions extending along the plate extraction direction C as accessible portions to inside and outside. More specifically, in the magazine cassette 50, on the forward side of the plate extraction direction C (i.e., on the plate placement device 12 side) is formed a plate feed opening 111 which is accessed for the housed plates 6 to be extracted for component feed and thereafter housed therein. Also, on the rearward side of the plate extraction direction C is formed a plate replacement opening 112 which is accessed for housing of the plates 6 or replacement of the plates 6 over the component feed by the operator or the like. The plate feed opening 111 and the plate replacement opening 112 are formed between end portions of the individual side wall portions 50*a* along the plate extraction direction C. In the individual side wall portions 50*a*, recess portions 50*b* are formed so as to extend to proximities to the end portions, respectively.

Figure 13:
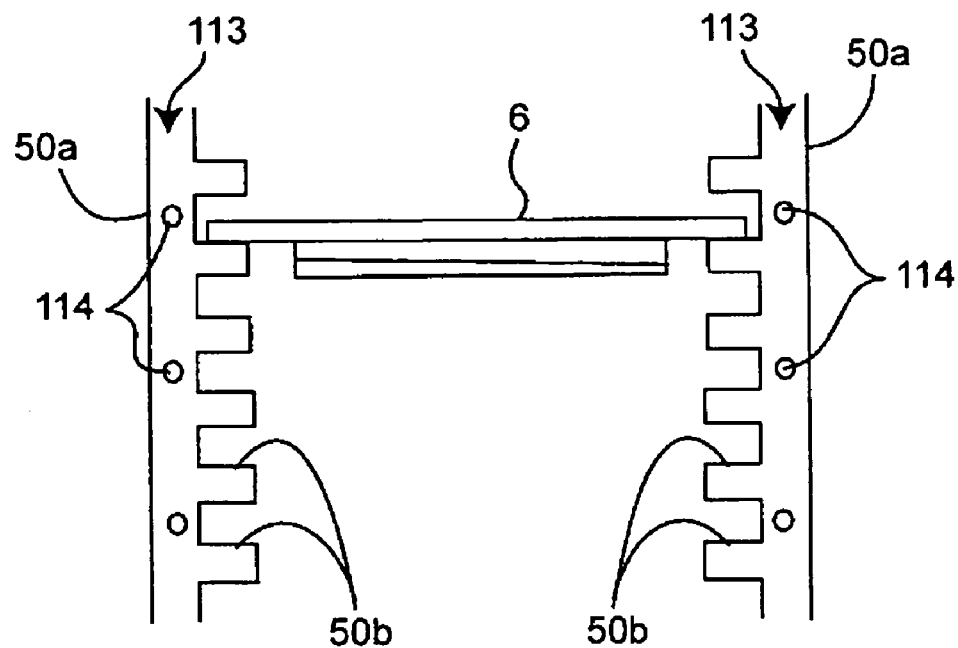
FIG. 13 is a schematic side view of the magazine cassette, showing a state that the plate is supported in a generally horizontal support posture.

In this connection, FIG. 13 is a schematic view showing a state of the magazine cassette 50, as viewed from the plate replacement opening 112. As shown in FIG. 13, a plurality of identification mark portions 114 that allow individual paired sets of recess portions 50*b* to be visually discerned from the other recess portions 50*b* are formed in end faces 113 of the individual side wall portions 50*a* in the plate replacement opening 112 of the magazine cassette 50.

Figure 20A:
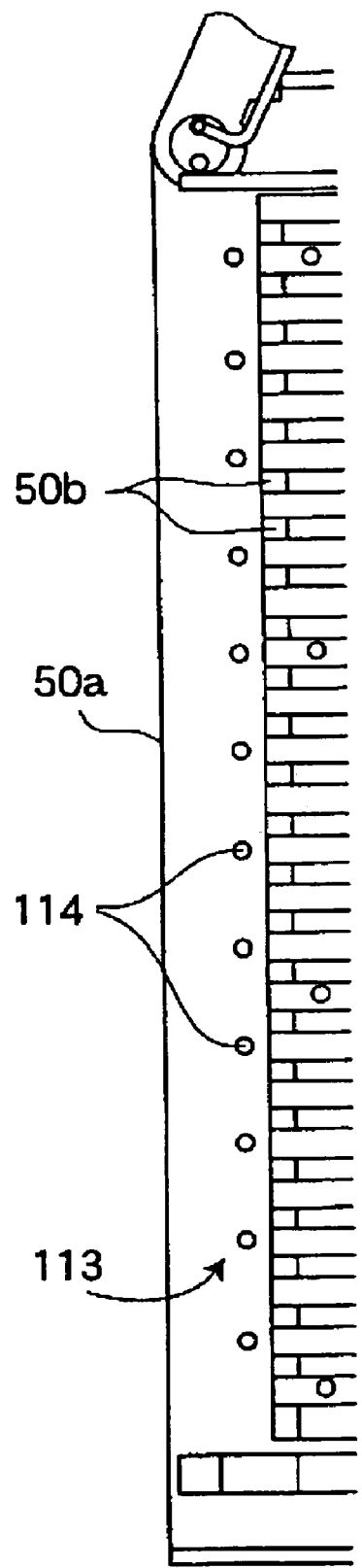
FIG. 20A is a view showing an end face of each side wall portion in the magazine cassette of FIG. 13, where the end face of a left-hand side wall portion is shown.
Figure 20B:
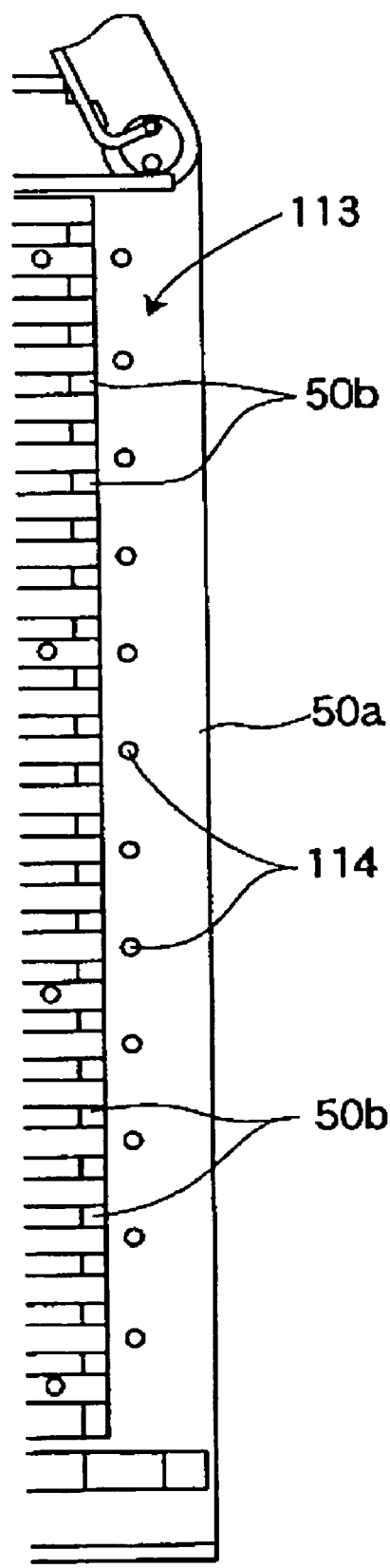
FIG. 20B is a view showing an end face of each side wall portion in the magazine cassette of FIG. 13, where the end face of a right-hand side wall portion is shown.

More specifically, in the end faces 113 of the individual side wall portions 50*a* in close proximities to paired sets of recess portions 50*b*, for example, holes are formed by cutting process, by which the individual identification mark portions 114 are formed. In the individual recess portions 50*b*, the identification mark portions 114 are formed every other step, so that such every-other-step formation allows each one paired set of recess portions 50b to be clearly distinguished from the one-step lower and one-step upper paired sets of recess portions 50b. In addition, partial side views of the plate replacement opening 112 of the magazine cassette 50, which materialize the schematic view shown in FIG. 13, are shown in FIGS. 20A and 20B.

Thus, in the magazine cassette 50, by the arrangement that the individual identification mark portions 114 are formed in the end faces of the side wall portions 50a in the plate replacement opening 112, where housing work and replacement work for the plates 6 by the operator are performed, it becomes possible for the operator to easily discern the identification mark portions 114 during the work, so that the paired sets of recess portions 50b can be clearly distinguished from the identification mark portions 114 forming one-step upper and one-step lower steps of sets by the discernment. Accordingly, as shown in FIG. 13, the plate 6 can reliably be housed in a generally horizontal support posture in the magazine cassette 50.

Figure 14:
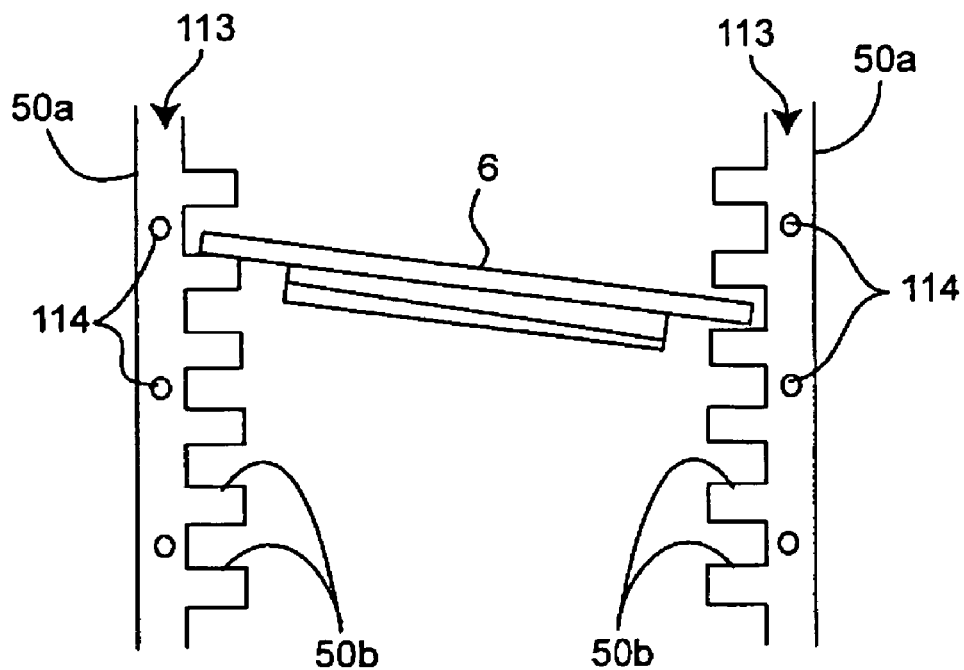
FIG. 14 is a schematic side view of the magazine cassette, showing a state that the plate is supported in a support posture which is in a skewed housing state.

Further, even if the operator has not discerned the identification mark portions 114 in the housing of the plates 6 into the magazine cassette 50 and if a plate 6 has been housed in a skewed housing state as shown in FIG. 14, the operator is enabled to recognize easily and promptly the support posture of the skewed housing state by discerning the identification mark portions 114 and the plates 6 after the housing work. By the recognition of such a state, the plate 6 can be carried in its support posture before the plates 6 housed in the magazine cassette 50 start to be fed, thus making it possible to fulfill reliable component feed.

Whereas the identification mark portions 114 are formed every other step with respect to paired sets of recess portions 50b, forming the identification mark portions 114 for all the steps would make it necessary that the identification mark portions 114, for assurance of their information function, be varied in configuration or the like individually. Also, as compared with the case of where the identification mark portions 114 are formed every two or more steps, it is considered that the case of every-other-step formation is higher in identification function, but the placement interval of the identification mark portions 114 is preferably determined by taking into consideration the placement interval pitch of the recess portions 50b.

Further, forming such identification mark portions 114 as configurational marks by boring process in the end faces 113 of the side wall portions 50a makes it simpler to do their formation work, as compared with, for example, a case where seals marked with identification numbers or the like are affixed to the end faces 113.

Figure 15:
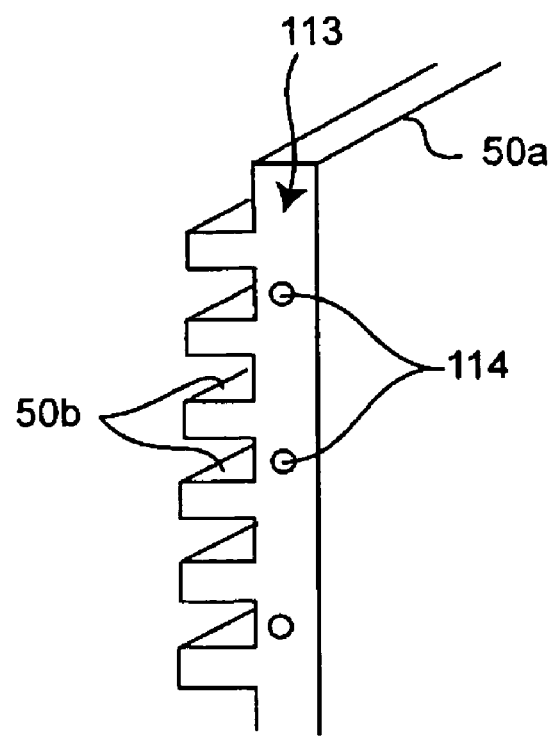
FIG. 15 is a schematic view showing an end face of a side wall portion of the magazine cassette.
Figure 17:
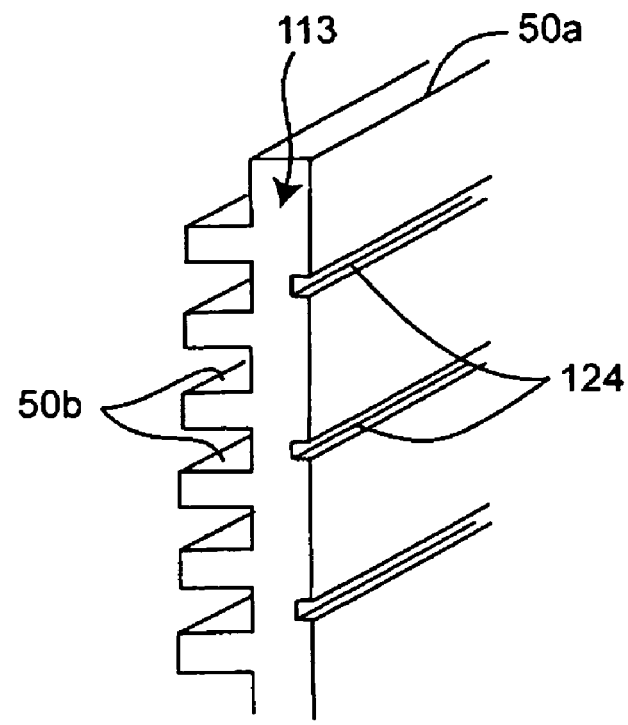
FIG. 17 is a schematic view showing an end face of a side wall portion of the magazine cassette, showing a state that an identification mark portion having a recessed configuration.

The form of such identification mark portions 114 are not limited to the case of the formation by boring process in the end faces 114 of the side wall portions 50a as shown in FIG. 15. Instead of such a case, for example, a plurality of recessed identification mark portions 124 may be formed in the outer peripheral surface of the side wall portion 50a as shown in FIG. 17. In the case of such formation of recessed identification mark portions, those identification mark portions can be formed by extrusion molding, and moreover formed integrally with the side wall portions 50a, so that efficient formation of the identification mark portions 124 can be achieved without requiring any additional work for the formation of the identification mark portions 124.

Figure 19:
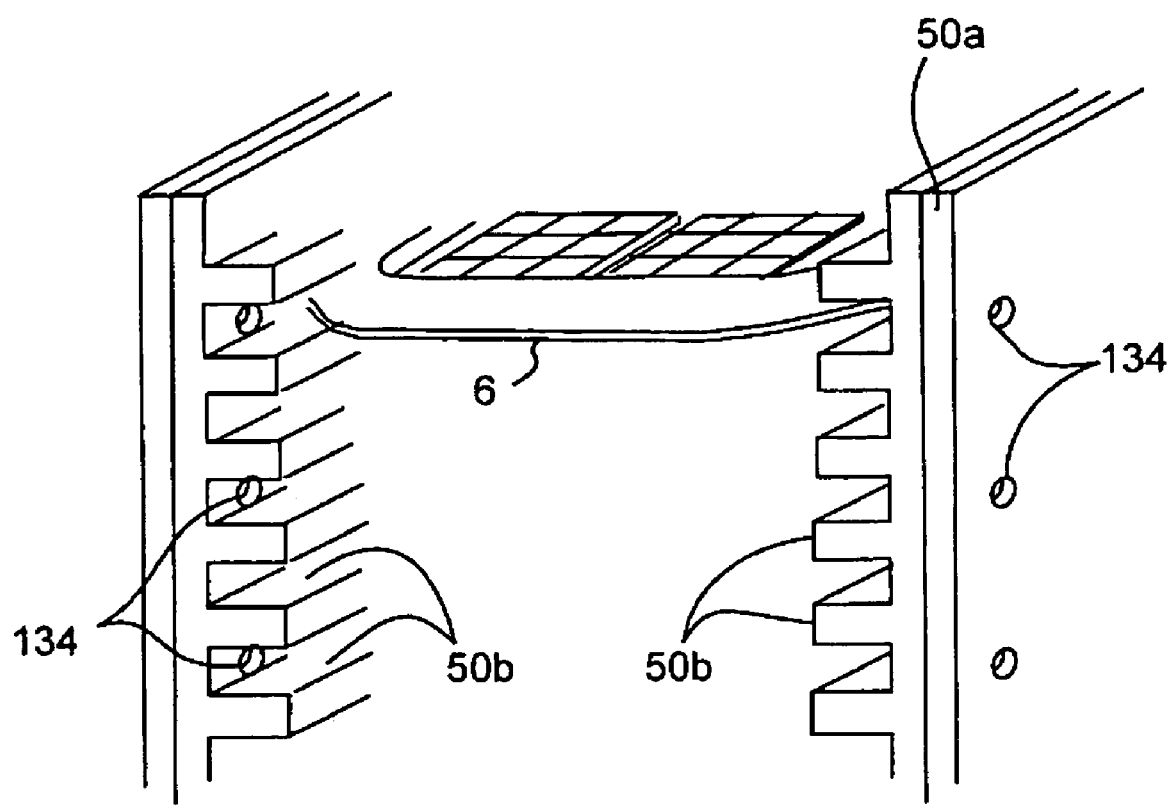
FIG. 19 is a schematic perspective view of the magazine cassette, showing a state that identification mark portions are formed in outer peripheral surfaces of the individual side wall portions.

It is also possible that boring the side faces of the side wall portions 50a as shown in FIG. 19 to form identification mark portions 134.

Figure 16:
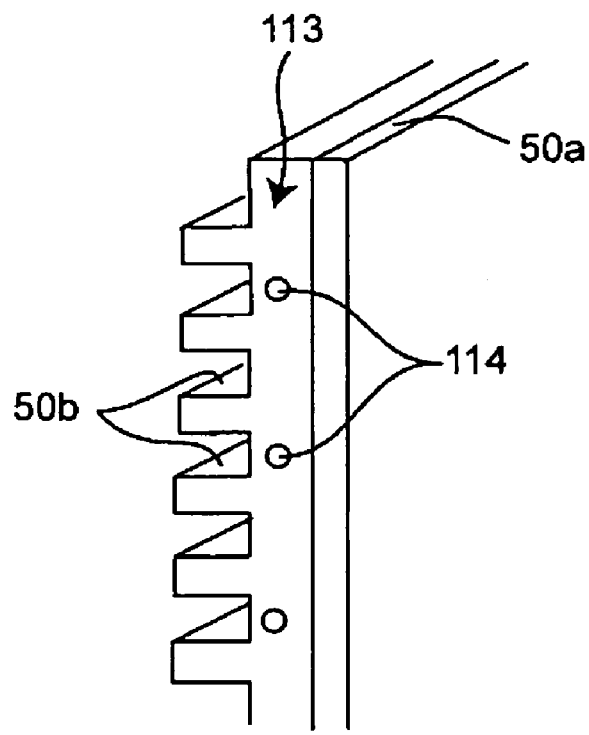
FIG. 16 is a view showing a state of the magazine cassette of FIG. 15 that the side wall portion is formed in a two-layer structure.
Figure 18:
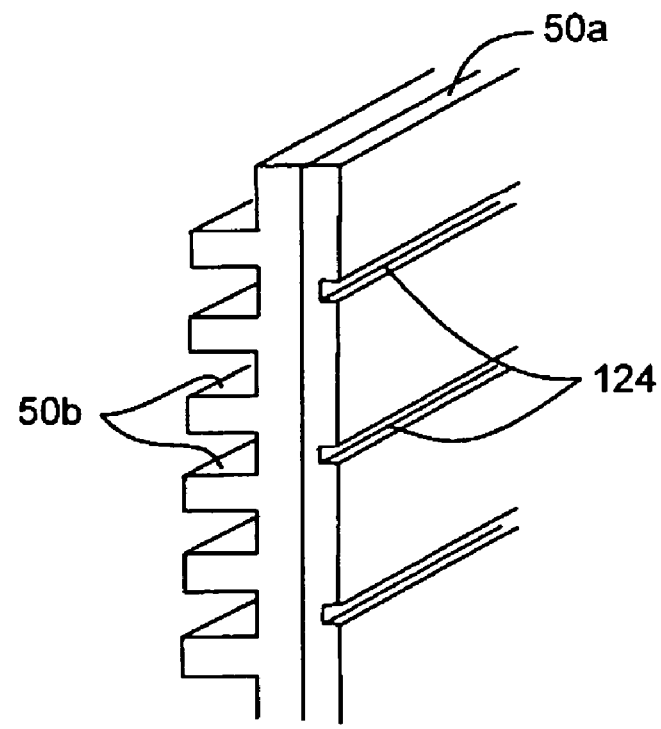
FIG. 18 is a view showing a state of the magazine cassette of FIG. 17 that the side wall portion is formed in a two-layer structure.

Furthermore, as shown in FIG. 16, the recess portions 50b to be brought into contact with the individual plates 6 may be formed integrally from, for example, resin, where the side wall portions 50a themselves may be formed from aluminum, in order that occurrence of chips due to the contact can be reduced. It is noted that such selection of formation materials may be applied also to the magazine cassettes shown in FIGS. 18 and 19.

Effects by Embodiment

According to the first embodiment, various effects shown below can be obtained.

First, in the magazine cassette 50 for housing therein the plates 6, since the identification mark portions 114 that allow each one paired set of recess portions 50b to be visually discriminated from one-step upper and one-step lower recess portions 50b are formed in the end faces 113 of the side wall portions 50a positioned around the plate replacement opening 112, which is the operator's work side opening portion, an alert can be issued to an occurrence that a plate 6 is housed in a skewed housing state in the housing work for the plates 6 into the magazine cassette 50 by the operator, so that the plates 6 can be housed in a normal support posture.

As a result of the housing of the plates 6 in a normal support posture as shown above, the extraction operation of the plates 6 from the magazine cassette 50 to be done subsequently can be carried out smoothly and reliably, making it possible to fulfill efficient, reliable component feed. Further, in the case where the extraction is carried out in a support posture of the skewed housing state, contact resistance between in-contact individual recess portions 50b and end portions of the plates 6 increases, resulting in occurrence of chips. However, by the housing of the plates 6 in a generally horizontal support posture, occurrence of such problems can be prevented, making it possible to fulfill higher-precision, reliable component feed for component mounting.

Also, the identification mark portions 114, 124 and 134 are not those by patterning of seals, coating or the like but configurational mark portions by profiling. Thus, the formation work for these identification mark portions 114 or the like can be simplified.

Further, since move-down positions for the plate presser members 61 in the plate placement device 12 of the component feeder 4, in which component feed is carried out by using such a magazine cassette 50, can be selectively regulated by the intermediate stopper drive unit 69, regulating the move-down positions according to the type of the plates 6 placed on the plate placement device 12 makes it possible to reliably fulfill the holding of the tray feed plate 6t, and moreover, releasing the regulation for the move-down positions makes it possible to perform the expansion of the wafer sheet 8 while the wafer feed plate 6w keeps reliably held, thus allowing an extraction operation to be achieved. Accordingly, proper holding operation and expanding operation can be performed selectively and automatically depending on the type of the plates 6 to be placed and fed, so that efficient component feed becomes achievable.

The discrimination as to the type of the plates 6 can be done by using the plate distinguishing sensor 41b provided in adjacency to the chuck 41 that grasps an end portion of the plate 6 in the extraction of the plates 6 compositely placed on the magazine cassette 50. More specifically, only for the tray feed plate 6t, the identification hole 56 is provided at end portion of the plate 6, where the presence or absence of the identification hole 56 is discriminated by the plate distinguishing sensor 41b, by which the type of the plate 6 can be discriminated. Also, by determining the move position of the intermediate stopper 69a by the intermediate stopper drive unit 69 based on the discrimination result, the regulation of the move-down positions of the individual plate presser members 61 can be selectively performed.

Furthermore, the move-down positions of the plate presser members 61 are so regulated that the fore end portion 63a of the expanding member 63 that is to be brought into contact with the wafer sheet 8 of the wafer feed plate 6w to make an expansion is prevented from contact with the lower face of the tray feed plate 6t. As a result of this, the fore end portion of the expanding member 63 can be prevented from being damaged.

Further, in the plate placement device 12, by its inclusion of a plurality of plate support portions 60 which are made variable in their support height positions, the individual plate 6 can be held at proximities to the outer peripheral portion of the plates 6, and besides their support height positions can be freely varied with the plate holding maintained in accordance with the move-up and -down operations of the plate presser members 61. Thus, the above-described effects become achievable.

Further, by the inclusion of the taper support portion 65 having the slant end portion 65a at its fore end, the end portion of the plate 6 can be brought into contact with the slant end portion 65a, by which the support position along the surface of the plate 6 can be held by an angular resistance, allowing a reliable, accurate holding to be achieved.

Second Embodiment

The present invention is not limited to the above-described embodiment, and may be embodied in other various modes. As an example, a component feeder according to a second embodiment of the invention is described below. Since the component feeder of the second embodiment, although differing in partial structures shown below, yet has a basic structure common to the component feeder 4 of the first embodiment, structural parts similar to those of the component feeder 4 of the first embodiment are designated by like reference numerals for an easier understanding of the following description.

Figure 21:
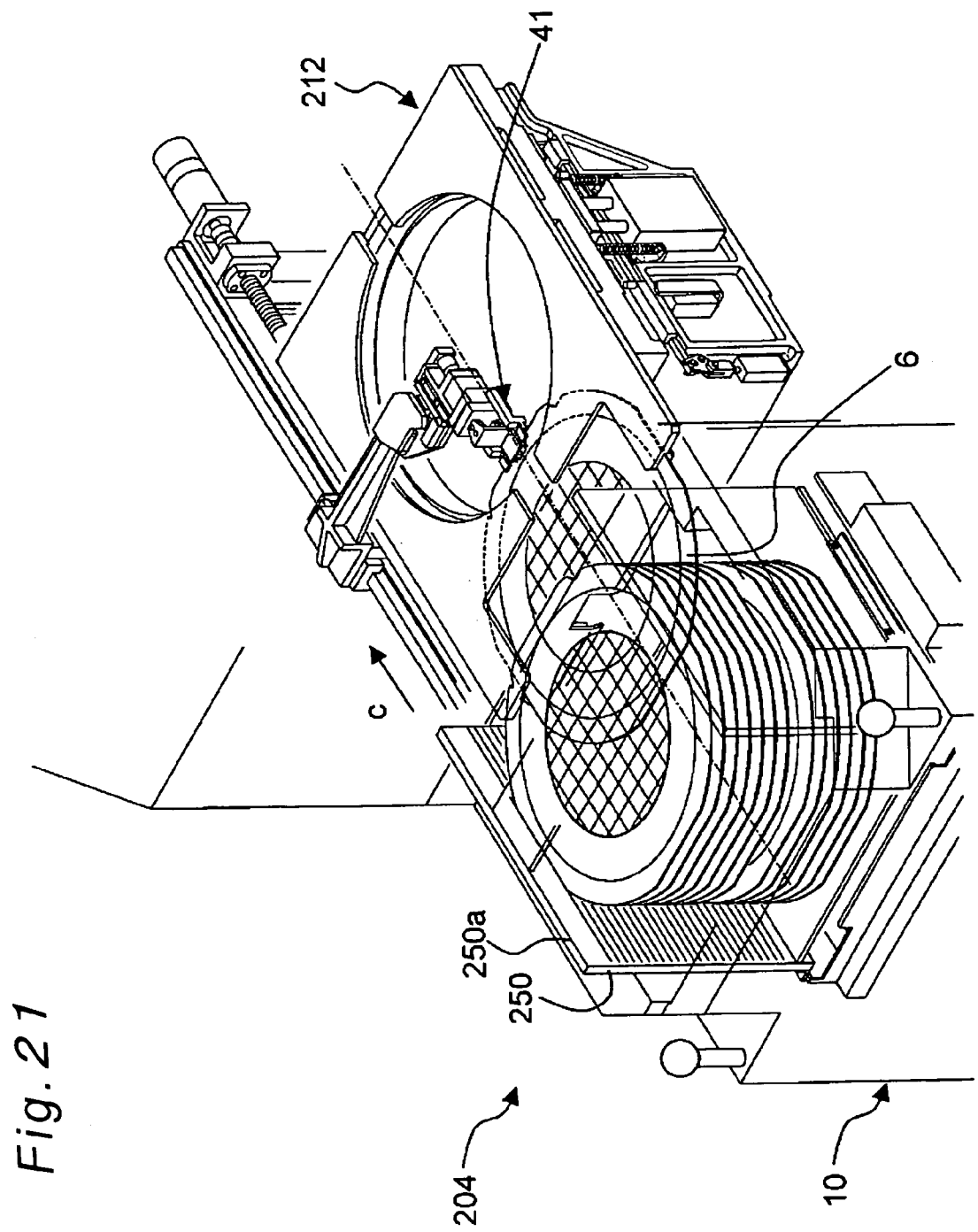
FIG. 21 is an enlarged semitransparent perspective view of a component feeder according to a second embodiment of the invention.

Referring to a component feeder 204 shown in FIG. 21, a lifter device 10 includes a magazine cassette 250 for compositely placing and storing therein a plurality of the wafer feed plates and a plurality of tray feed plates. In the magazine cassette 250, as in the first embodiment, side wall portions 250a are provided so as to be opposed to each other in a direction perpendicular to the plate extraction direction C, and a plurality of recess portions 250b are formed in the mutually opposing side faces of the side wall portions 250a along the plate extraction direction C. The plates are held and stored in the magazine cassette 250 by having their mutually opposing both end portions engaged with and supported by mutually opposing paired sets of recess portions 250b of the individual side wall portions 250a. These individual recess portions 250b are an example of the support guide portions. It is noted that the recess portions 250b are formed at a regular interval pitch in the side wall portions 250a, and the plates, while being engaged with and held by the recess portions 250b, have their surfaces set in a generally horizontal state. Further, the plates are movable back and forth (i.e., movable in sliding) along the plate extraction direction C while being guided along the direction in which the mutually opposing sets of recess portions 50b are formed.

Figure 22:
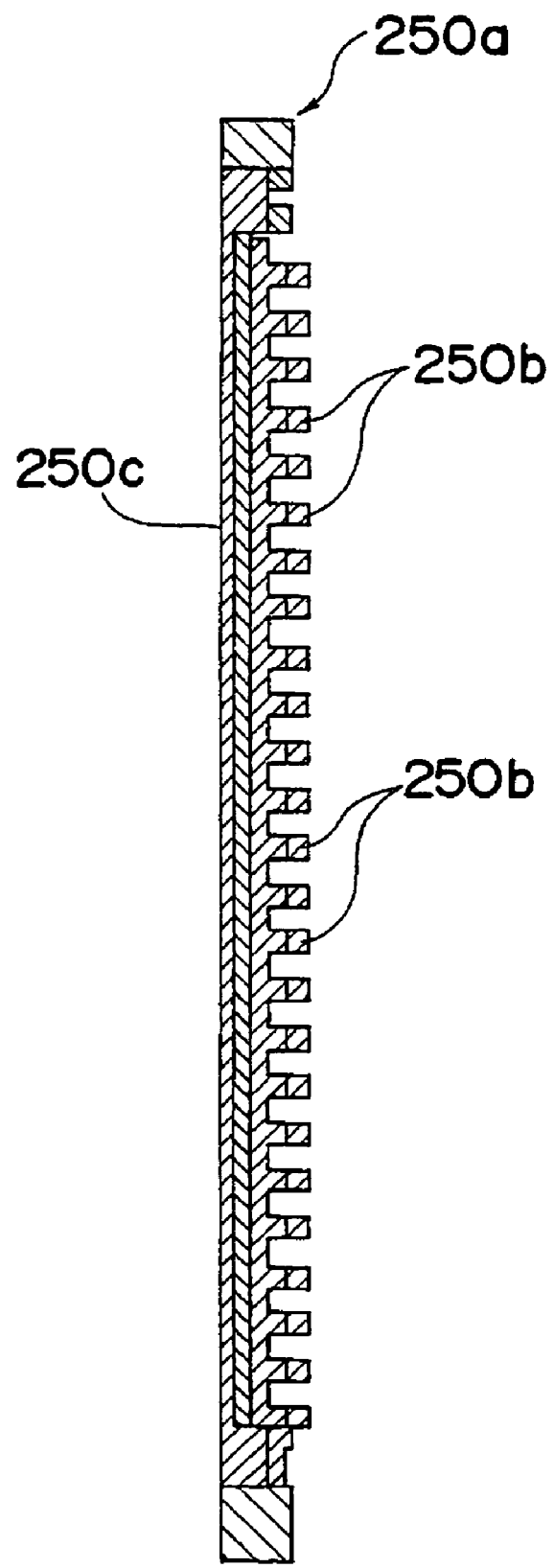
FIG. 22 is a sectional view of a side wall portion of a magazine cassette included in the component feeder.

Now, a partial sectional view of the side wall portions 250a of the magazine cassette 250 is shown in FIG. 22. As shown in FIG. 22, the side wall portion 250a is so structured that the recess portions 250b formed integrally by using DURACON (registered trademark, POM (Polyoxymethylene)), which is a thermoplastic resin, is fixed to a plate 250c made of aluminum, which is a metal material. Since DURACON is characterized by being a soft material and lower in surface hardness than stainless material (e.g., JIS Standard: SUS304) that is the formation material of the tray ring 59 and the wafer ring 9, occurrence amounts of chips or the like due to contact wear can be reduced even if the recess portions 250b and the plates 6 are brought into contact at their contact surfaces. Also, by the use of a thermoplastic resin material, it becomes possible to easily form the recess portions 250b which are so structured that a plurality of depressions and projections are provided to succeed one after another. It is noted that the combination of formation materials for the recess portions 250b, the tray ring 59 and the like are not limited to the above combination. It is required only that the formation material of the recess portions 250b is lower in hardness than the formation material of the tray ring 59, and other various combinations may be adopted under such a condition.

Further, when a surface of such recess portions 250b which is to be brought into contact with the tray ring 59 or the wafer ring 9, for example, is subjected to TUFRAM plating process, friction at the contact portions with the tray ring 59 or the wafer ring 9 can be further reduced, so that their slidability can be improved.

A side view of one recess portion 250b, showing a further detailed structure of such recess portions 250b, is shown in FIG. 23A, and a front view thereof is shown in FIG. 23B. Although the recess portions 250b are integrally formed, yet the one recess portion 250b is cut out and represented in FIGS. 23A and 23B for an easier understanding of the following description on the structure of the recess portions 250b.

As shown in FIG. 23A, a slant surface (an example of a smooth surface portion), which is a surface slightly slanted with respect to the plate extraction direction C, is formed at an end portion of the or each recess portion 250b on the plate extraction direction C side, i.e., at an insertion end portion 250d of the plate 6. Also, as shown in FIG. 23B, the slant surface is composed of a lower-portion-side slant surface 250e slanted in a downward direction with respect to the plate extraction direction C as viewed in the figure, which is a direction generally perpendicular to the surface of the plate 6, and a side-portion-side slant surface 250f slanted in a leftward direction in the figure which is a direction extending generally along the surface of the plate 6.

Since the lower-portion-side slant surface 250e and the side-portion-side slant surface 250f are formed at the insertion end portion 250d of the recess portion 250b, friction between an end portion of a plate 6 and the insertion end portion 250d of the recess portion 250b that supports and guides the plate 6 can be alleviated even in cases where the plate 6 is inserted in a direction opposite to the plate extraction direction C in the figure, thus allowing a smooth insertion of the plate 6 to be fulfilled. Further, in the insertion of the plate 6, there can be produced an effect that even if a positional shift has occurred between a support position of the plate 6 by the recess portion 250b and an insertion position of the plate 6 into the recess portion 250b in the direction perpendicular to the plate extraction direction C, the positional shift can be corrected by guiding the plate 6 by the lower-portion-side slant surface 250e and the side-portion-side slant surface 250f to conduct the insertion.

Figure 24:
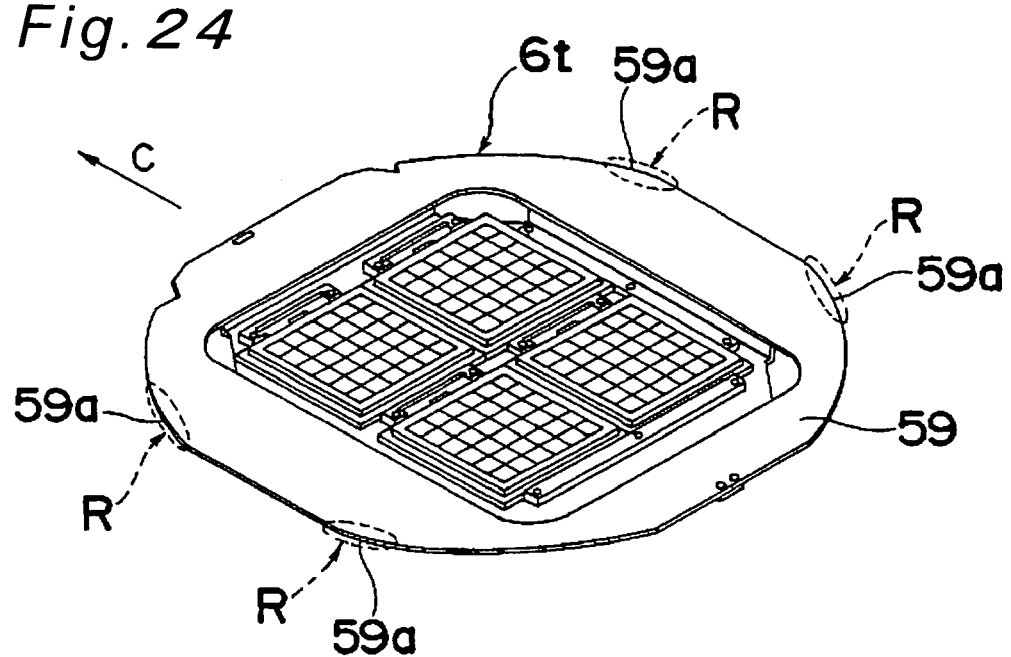
FIG. 24 is an appearance perspective view of a tray feed plate.
Figure 25:
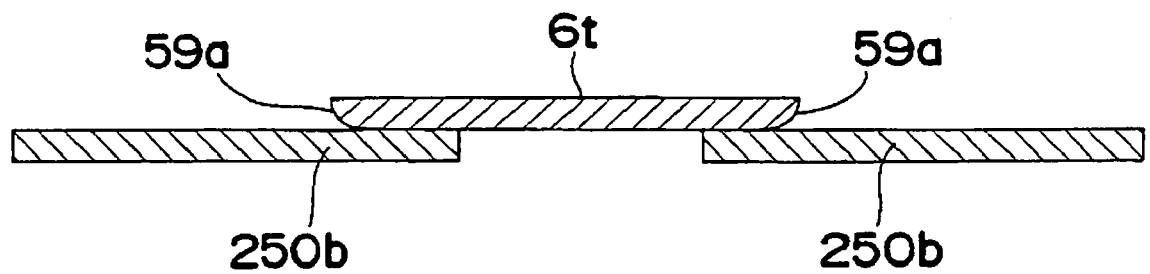
FIG. 25 is a schematic sectional view showing a state that the tray feed plate of FIG. 24 is supported by a recess portion.

Next, FIG. 24 shows an appearance perspective view of the tray feed plate 6t. At four connecting portions (R) at which mutually opposing end portions (linearly formed end portions) of the tray ring 59 of the tray feed plate 6t shown in FIG. 24 in the plate extraction direction C and partly circular-arced end portions are connected with each other, corner portions of their low-face end portions are cut out so as to be formed into smooth surface portions 59a made of smooth curves. Since such individual connecting portions R are contact portions with the individual recess portions 250b of the magazine cassette 250, the friction between the smooth surface portions 59a and the recess portions 250b can be reduced even if the tray feed plate 6t is moved back and forth along the plate extraction direction C as it is supported by the recess portions 250b as shown in FIG. 25. Accordingly, in the insertion or extraction of the tray feed plates 6t into and from the magazine cassette 250, the amount of chips generated by contact wear between the tray feed plates 6t and the recess portions 250b can be reduced. In addition, such formation of the smooth surface portions 59a in the tray feed plate 6t as shown above can effectively be applied to wafer feed plates 6w having a weight characteristic of being heavier than the wafer feed plate 6w. However, the smooth surface portions may be formed also on the wafer feed plates 6w so as to reduce the amount of further generation of chips.

Figure 26:
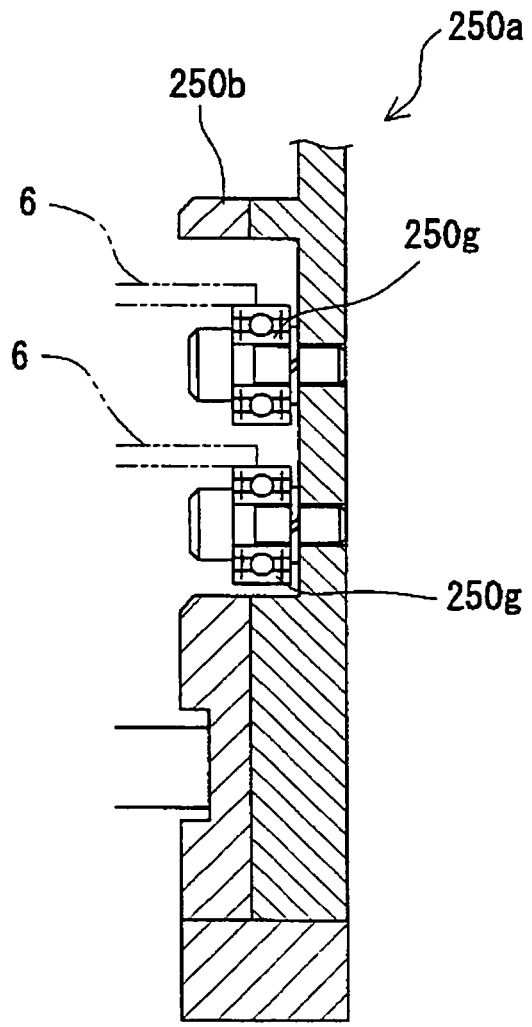
FIG. 26 is a partial sectional view showing a form of the recess portion according to a modification of the second embodiment, showing a form of the recess portion including a roller.
Figure 27:
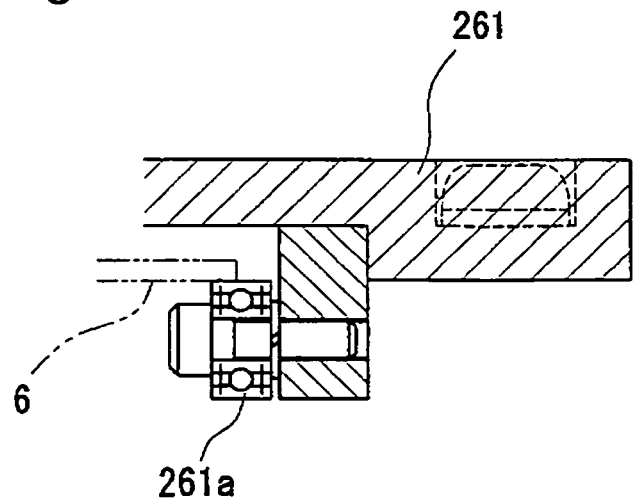
FIG. 27 is a partial sectional view of a state that the roller is included in a plate presser member.

Furthermore, in the recess portions 250b of the magazine cassette 250, as shown in FIG. 26, a plurality of rollers 250g which are an example of a rotating member for supporting each plate 6 and guiding its move along the plate extraction direction C may be provided. By the provision of such rollers 250g, the frictional force due to the contact between the plates 6 and the recess portions 250b can be reduced to a great extent, so that generation of chips or the like due to the contact can be suppressed. In addition, as shown in FIG. 27, such rollers 261a may be provided so as to support the plates 6 at lower faces of plate presser members 261, respectively, of a plate placement device 212 to which the plates 6 are to be inserted and placed. In such a case, it becomes possible to reduce the amount of generation of chips or the like due to the contact wear of the plates 6 not only in the magazine cassette 250 but also in the plate placement device 212.

Here is described a case where the tray ring 59 and the wafer ring 9 are formed from other materials instead of the case where, at the side wall portions 250a of the magazine cassette 250, the recess portions 250b are formed by using DURACON, which is a thermoplastic resin, in the plate 250c made of aluminum and the tray ring 59 and the wafer ring 9 are formed from stainless material.

As described above, forming the recess portions 250b from resin allows the amount of generation of chips or the like due to the contact with the plates 6. However, in the field of component mounting, there are strong desires for the magazine cassette 250 to comply with standard specifications as much as possible in terms of generality of the magazine cassette 250. In such cases, effects similar to those described above can be obtained by, conversely, selecting the aforementioned formation materials for the plates 6 in view of their lower surface hardnesses, rather than selecting the formation materials of the recess portions 250b in the magazine cassette 250.

Figure 28:
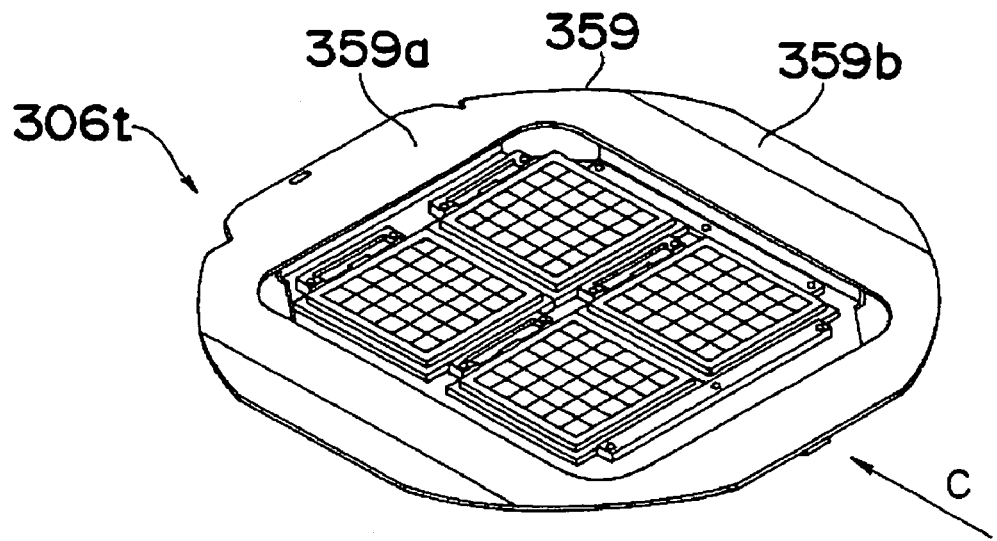
FIG. 28 is a perspective view of a tray feed plate according to a modification of the second embodiment.
Figure 29:
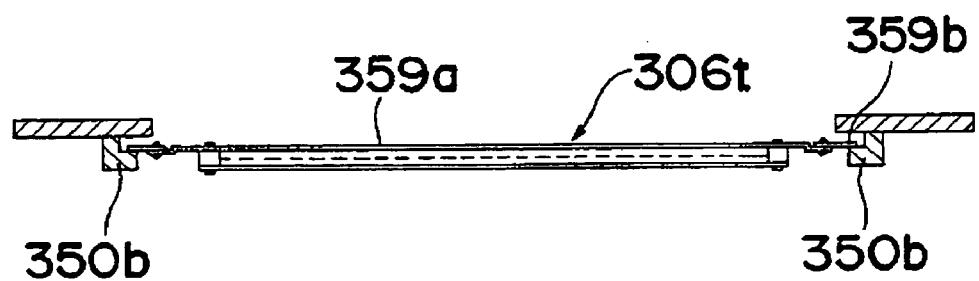
FIG. 29 is a side view of the tray feed plate of FIG. 28.

More specifically, as shown in an appearance perspective view of a plate, e.g. tray feed plate 306t, of FIG. 28, end portions 359b of a tray ring 359 mutually opposing along the plate extraction direction C are formed from resin, for example, PEEK resin. Also, as shown in a side view (including partly a cross section) of the tray feed plate 306t which is supported on the recess portions 350b of the magazine cassette as viewed in the plate extraction direction C of FIG. 28, the recess portions 350b are formed from aluminum. Also, as shown in FIG. 29, a body portion 359a of the tray ring 359 is formed of, for example, an aluminum plate, and the individual end portions in the body portion 359a are bent to form step portions 359c, where a plate formed from PEEK resin is fitted to the step portions 359c, for example, by screwing, thus the end portions 359b being made up.

Since the end portions 359b of the tray ring 359 and the individual recess portions 350b of the magazine cassette made up as shown above, the amount of generation of chips or the like due to their mutual contact wear can be reduced without making the magazine cassette, to which generality is desired, in any special specifications. It is noted that the surfaces of the end portions 359b of the tray ring 359, or the surfaces of the recess portions 350b of the magazine cassette, may be subjected to simplified surface treatment.

According to the second embodiment, in cases where the tray feed plate 6t having a weight characteristic of being heavier than the wafer feed plate 6w is inserted and housed in the magazine cassette 250 or extracted from the magazine cassette 250, even if the recess portions 250b and the plate 6 are subjected to contact move, the amount of generation of chips due to their sliding wear can be reduced to a great extent.

Also, since the tray feed plate 6t, differing from the wafer feed plate 6w, is so structured that a multiplicity of types of components can be compositely placed and housed on one tray feed plate 6t, there is a further feature that insertion and extraction to and from the magazine cassette 250 frequently occurs, as in the case where the tray feed plate 6t is stored into the magazine cassette 250 upon each completion of extraction of one type of component and thereafter, for the extraction of a different component from the stored tray feed plate 6t, the tray feed plate 6t is extracted again from the magazine cassette 250. Even with frequent occurrence of insertion and extraction like this, since the measures for suppression of generation of the chips are provided, combinational occurrence of drive troubles due to the generation of chips and degradation of maintainability or the like can be prevented. Thus, in the component feeder on which the wafer feed plates 6w and the tray feed plates 6t are compositely placed, maintainability improvement can be achieved and efficient component feed can be fulfilled.

Third Embodiment

Next, a component feeder according to a third embodiment of the invention is described below. Since the component feeder of the third embodiment, although differing in partial structures shown below, yet has a basic structure common to the component feeder 4 of the first embodiment, structural parts similar to those of the component feeder 4 of the first embodiment are designated by like reference numerals for an easier understanding of the following description.

Figure 30:
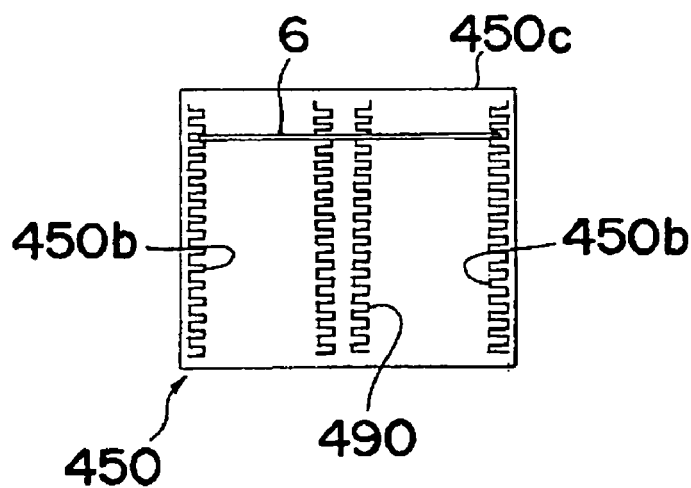
FIG. 30 is a schematic side view of a magazine cassette according to the third embodiment of the invention.

A schematic explanatory view of a magazine cassette 450 included in the component feeder according to the third embodiment as viewed from a front side is shown in FIG. 30, where the plate extraction direction C side is assumed as the front side.

As shown in FIG. 30, a multiplicity of recess portions 450b which are placed in opposition to each other are formed inside side wall portions 450a in the magazine cassette 450, where end portions of the plate 6 are supported by mutually opposing paired sets of recess portions 450b, by which the plate 6 can be housed while being held in a generally horizontal posture. Further, a depth-side wall portion 450c is provided also on the depth side in the figure in the magazine cassette 450, and the depth-side wall portion 450c includes a posture guide member 490 which, by being engaged with an end portion of the plate 6, makes it possible to hold the horizontal posture of the plate 6 as well as its horizontal posture with respect to the plate extraction direction C in normal postures.

More specifically, although not described in detail in the first embodiment, a posture guide block 59*a* engageable with the posture guide member 490 is formed in the lower face of an end portion of the tray feed plate 6*t* (i.e., an end portion of the tray ring 59) on one side opposite to the plate extraction direction C as shown in FIG. 5.

Figure 32:
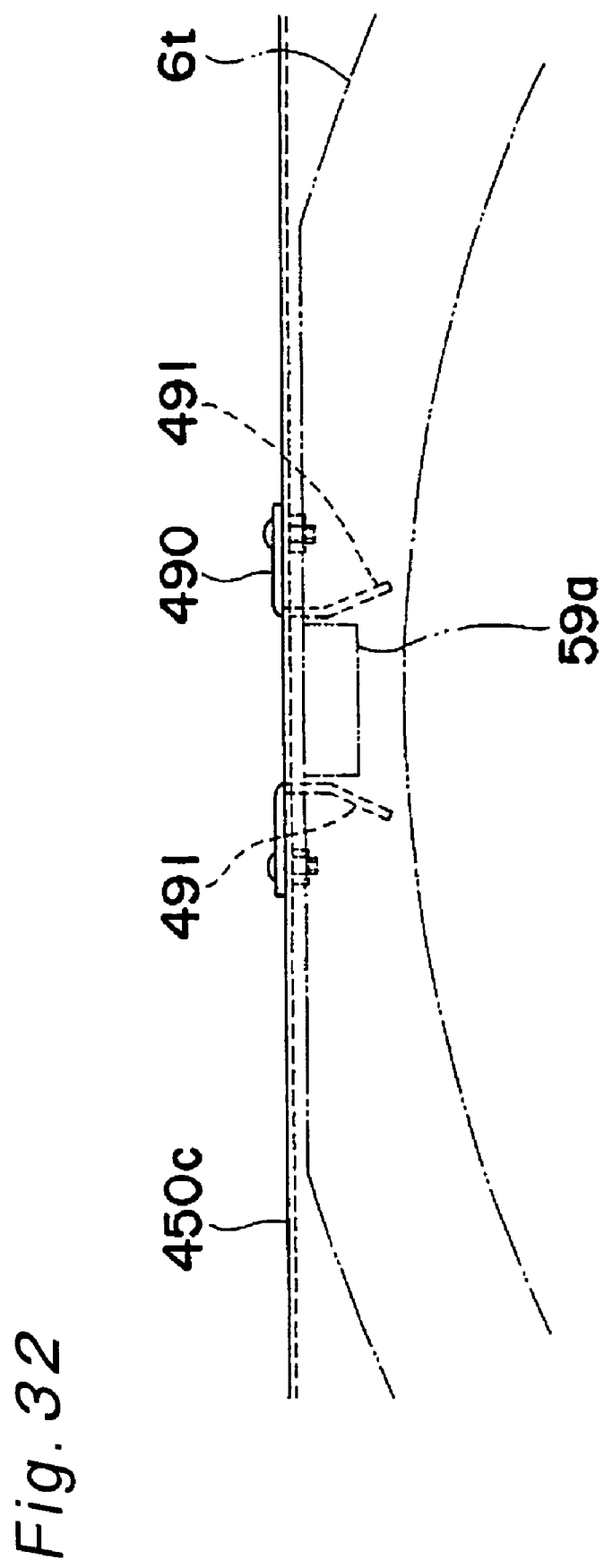
FIG. 32 is an enlarged plan view of a posture guide member included in the magazine cassette of FIG. 30.

In this connection, an enlarged plan view of a mutual engagement state between the posture guide block 59*a* included in the tray feed plate 6*t* and the posture guide member 490 included in the depth-side wall portion 450*c* of the magazine cassette 450 is shown in FIG. 32. Also, a detailed front view of the magazine cassette 450 in the same direction as in FIG. 30 is shown in FIG. 33, and a sectional view taken along the line V-V in the magazine cassette 450 of FIG. 33 is shown in FIG. 34.

Figure 33:
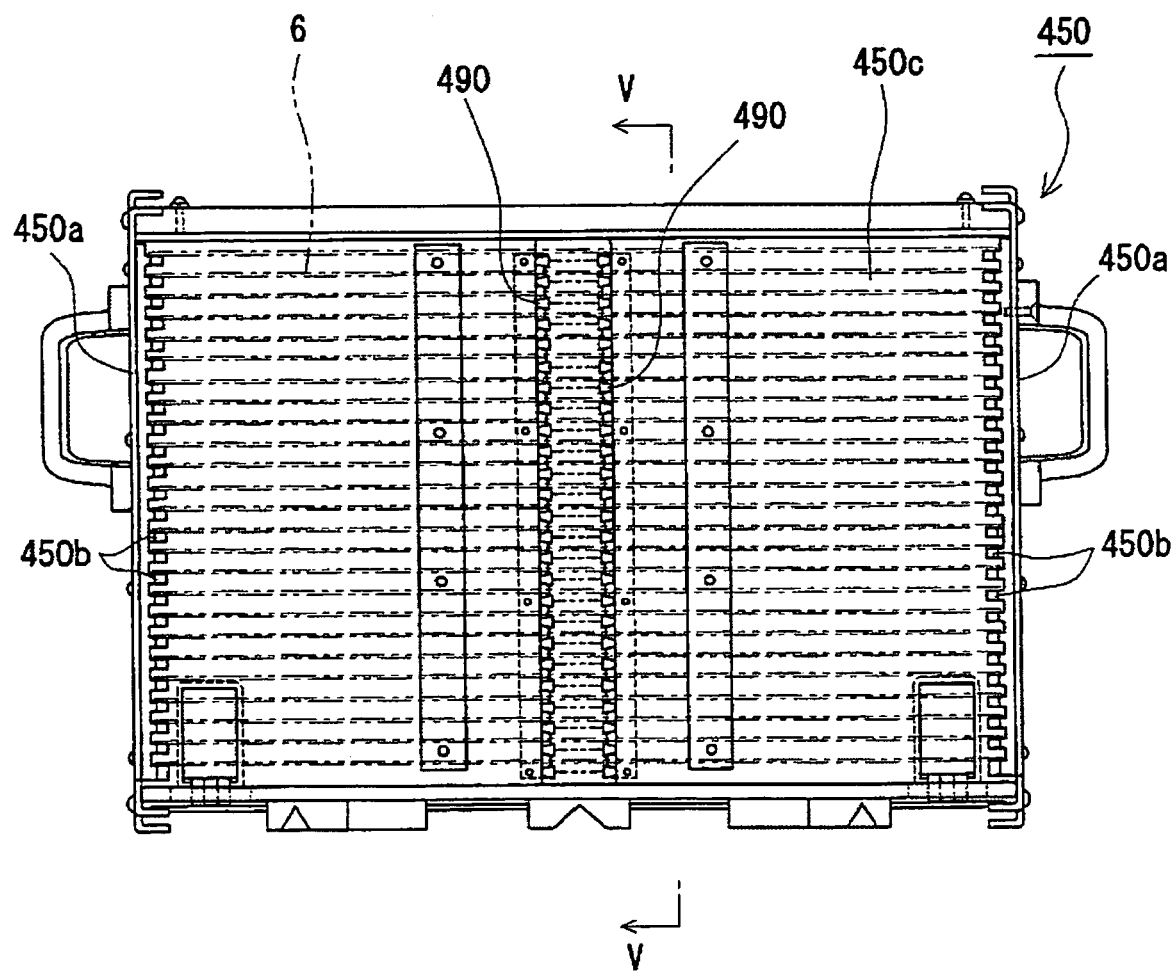
FIG. 33 is a side view of the magazine cassette of FIG. 30 as viewed from the plate extraction side.
Figure 34:
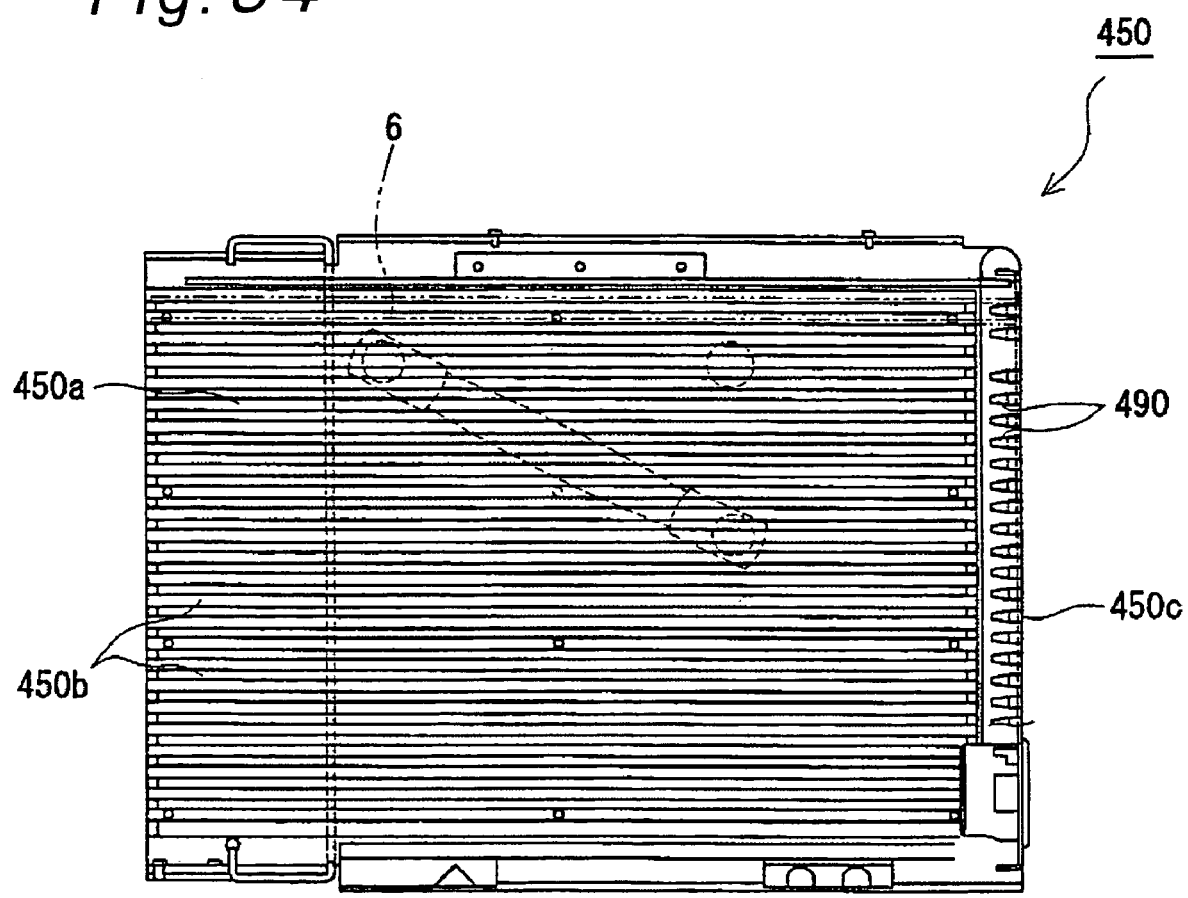
FIG. 34 is a sectional view of the magazine cassette of FIG. 33 taken along the line V-V.

As shown in FIGS. 33 and 34, near a generally center of the depth-side wall portion 450*c* of the magazine cassette 450, a plurality of posture guide members 490 are provided so as to be arrayed in one line vertically at an interval pitch equal to the interval pitch at which the recess portions 450*b* are formed. Also, as shown in FIG. 32, the posture guide members 490 are formed, for example, by being fitted to the depth-side wall portion 450*c* by screwing or the like in a fashion that two pin-like members 491 of a bent state are mutually opposed and kept at a specified distance from each other. Further, the specified distance between the pin-like members 491 is so set as to be generally equal to the formation width of the posture guide block 59*a* of the tray feed plate 6*t* in vicinities of the depth-side wall portion 450*c*, and increases with increasing distance from the depth-side wall portion 450*c*.

As shown above, by the provision of the posture guide members 490 included in the magazine cassette 450 and the posture guide block 59*a* included in each tray feed plate 6*t*, with regard to the tray feed plate 6*t* having its mutually opposing end portions supported by the mutually opposing sets of recess portions 450*b* of the magazine cassette 450, when the posture guide block 59*a* and the posture guide members 490 are engaged with each other as shown in FIG. 32, the tray feed plate 6*t* can be maintained in a normal posture horizontally with respect to the plate extraction direction C and moreover its support posture by the recess portions 450*b* can be maintained in a horizontal posture. In particular, since the distance between the individual pin-like members 491 of the posture guide members 490 is formed so as to be tapered as shown in FIG. 32, it becomes possible to easily fulfill the engagement between the posture guide block 59*a* and the posture guide members 490, and moreover the engagement can be accomplished while the posture of the tray feed plate 6*t* slanted horizontally with respect to the plate extraction direction C is corrected during the engagement process. In addition, in cases where the posture guide members 490 capable of detecting a skew of the support posture of the tray feed plate 6*t* are included in the magazine cassette 450 as shown above, the case may be that the identification mark portions are not provided in the magazine cassette 450.

Figure 31:
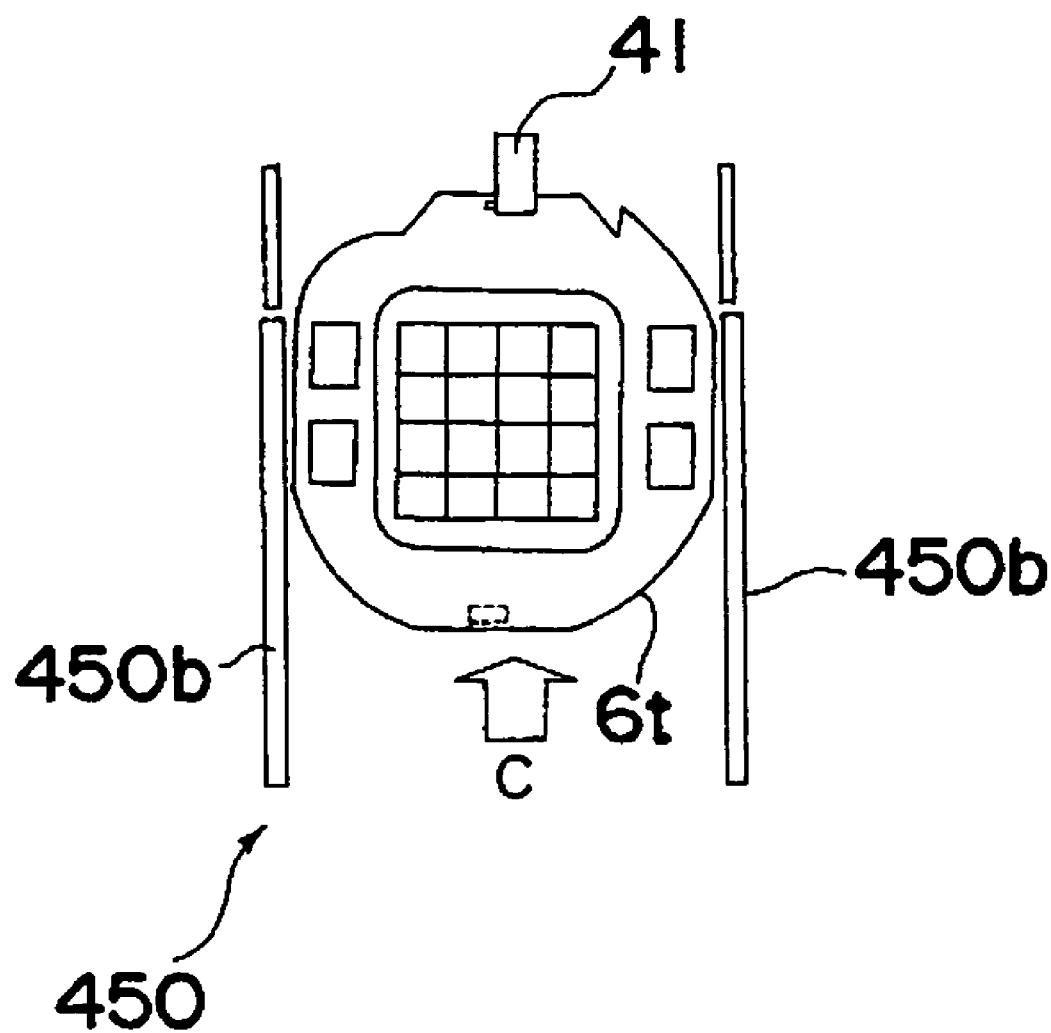
FIG. 31 is a schematic explanatory view showing a state that a plate housed in the magazine cassette of FIG. 30 is extracted.

Thus, since the support posture of the plates 6 housed in the magazine cassette 450 is maintained in a normal posture, extraction of the plates 6 from the magazine cassette 450 can be achieved smoothly while occurrence of pop-out of the components 2 from the tray feed plate 6*t* can be prevented, as shown in the schematic view of FIG. 31. Accordingly, random access to the plates 6 housed in the magazine cassette 450 can be performed efficiently, so that efficient component feed can be fulfilled.

The foregoing description has been made on a case, representative, where the plate 6 is a tray feed plate 6*t*. However, similar constitution may be adopted also for the wafer feed plate 6*w*.

Figure 40:
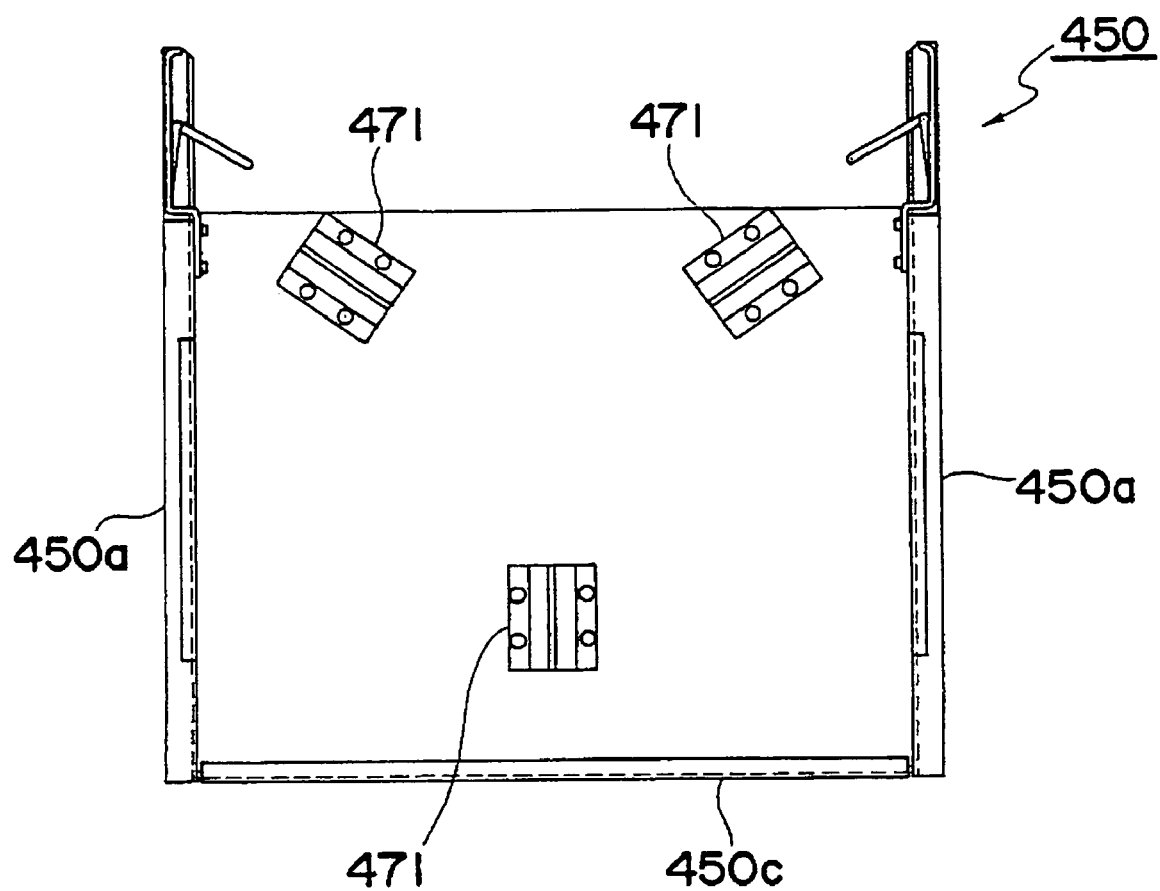
FIG. 40 is a view showing a bottom portion of the magazine cassette.

Further, in such a magazine cassette 450 in which the wafer feed plates 6*w* or the tray feed plates 6*t* are to be housed, it is considered that there may be a fear for influences of electrically charging of the magazine cassette 450 on the components 2. For instance, the charging amount would be, normally about 400 V to 600 V. Moreover, as shown in FIG. 40, coupling blocks 471 (which is an example of fixing members) for coupling (fixing) the magazine cassette 450 and the base 52 to each other are provided, for example, three in number at a bottom portion of the magazine cassette 450. In order to prevent such influences of charging on the components, for example, at least one coupling block 471 out of the three coupling blocks 471, when formed from electrically conductive material, is enabled to have a function as a grounding terminal, thus making it possible to ground the magazine cassette 450, where its charging amount can be reduced to several volts, for example, about 2 V.

The foregoing description has been made on a case where the posture guide members 490 are formed in the depth-side wall portion 450*c* of the magazine cassette 450. However, the third embodiment is not limited to such a case. Instead of such a case, a magazine cassette capable of obtaining the effects by the inclusion of the above-described posture guide members 490 and further improving the workability is explained as a modification of the third embodiment.

For component feeders or component mounting apparatuses using a magazine cassette for housing therein a multiplicity of plates 6, there is a need for performing replacement or resupply work for the plates 6 housed in the magazine cassette. Accordingly, for efficient component mounting or component feed, it is required that the workability in the replacement work for the plates 6 to the magazine cassette be made successful.

Figure 35:
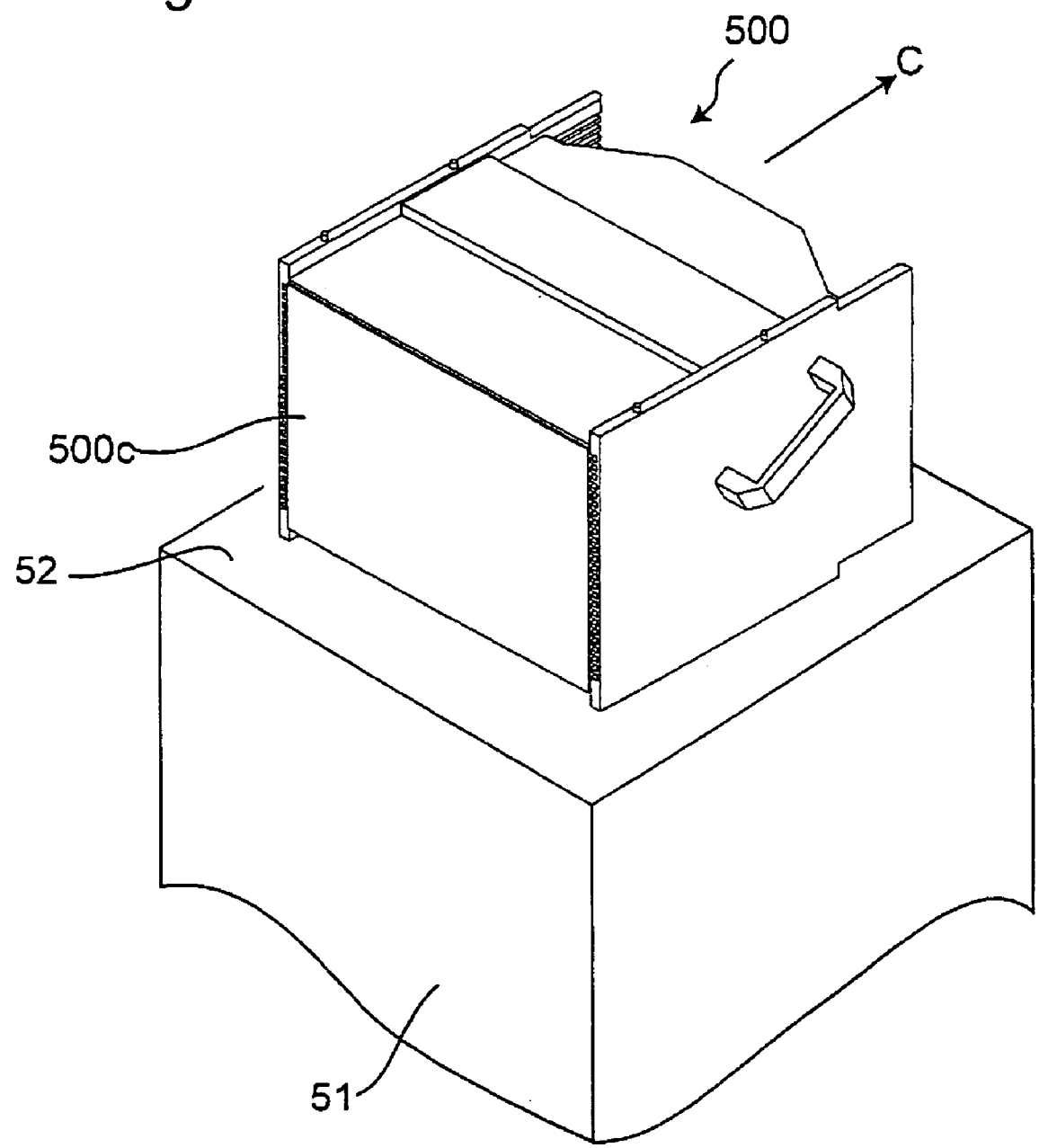
FIG. 35 is a schematic perspective view of a comparative magazine cassette for explaining the structure of a magazine cassette according to a modification of the third embodiment.

However, in a conventional magazine cassette 500 as shown in the schematic view of FIG. 35, a depth-side wall portion 500*c* of the magazine cassette 500, as viewed along the plate extraction direction C, is fixed to the body of the magazine cassette 500, making it necessary that for replacement of the plates 6 or the like, the magazine cassette 500 is positioned to a specified place by the cassette up/down unit 51 and removed from the base 52, where the replacement work of the plates 6 or the like is carried out from the opening portion on the plate extraction direction C side in the magazine cassette 500. Further, such a magazine cassette would generally be large in weight, for example, weighing about 20 to 30 kg, so that such fitting and removal work of the magazine cassette 500 by the operator would be a factor that inhibits the improvement of working efficiency. Moreover, removing the magazine cassette 500 may also cause a halt of operation of the component feeder, hence a desire for improvement of working efficiency from such a point of view. This modification is purposed to solve these and other issues related to random access and fulfill further improvement of working efficiency.

Figure 36:
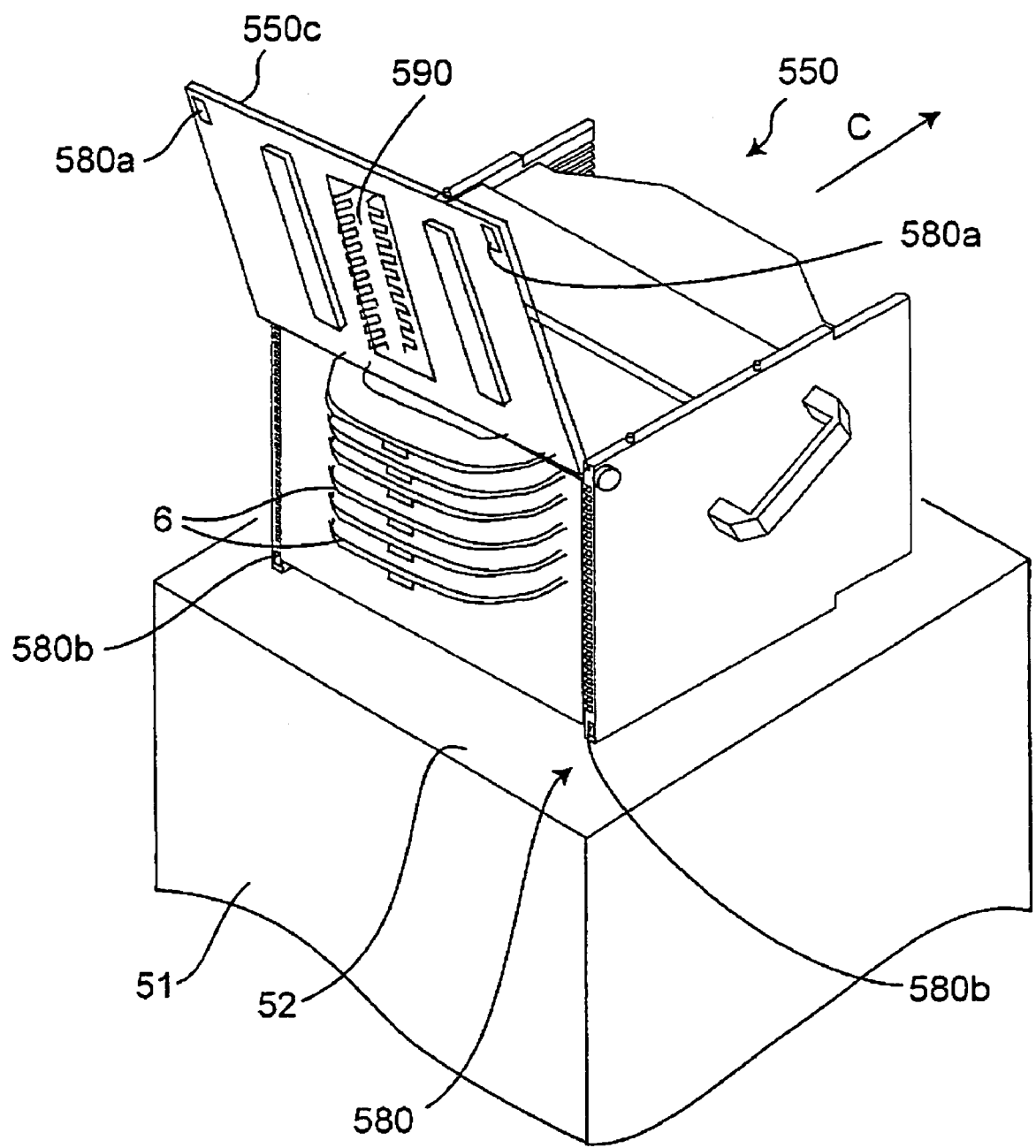
FIG. 36 is a schematic perspective view of the magazine cassette according to the modification of the third embodiment.
Figure 37:
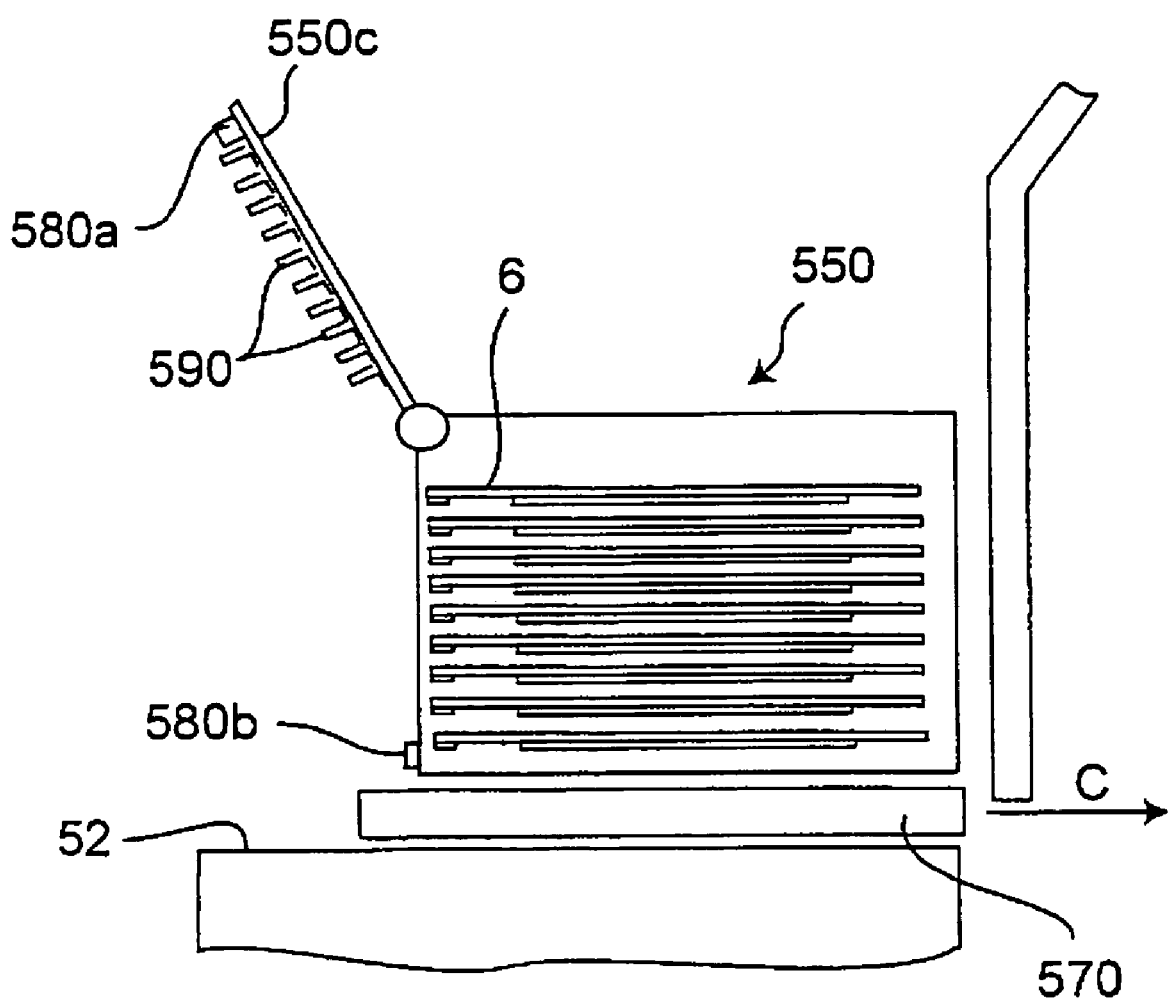
FIG. 37 is a cross-sectional schematic view showing the structure of the magazine cassette of FIG. 36.

First, a schematic perspective view of a magazine cassette 550 according to this modification is shown in FIG. 36, and besides a sectional-view-like schematic explanatory view of the magazine cassette 550 is shown in FIG. 37.

As shown in FIGS. 36 and 37, the magazine cassette 550 differs in structure from the magazine cassette 450 of the third embodiment in that the depth-side wall portion serves as an opening/closing cover 550*c*, which is an example of an openable/closable door, with respect to the plate extraction direction C. Also, inside the opening/closing cover 550c, a posture guide member 590 for maintaining the support posture of the plates 6 in a normal posture is included as in the case of the depth-side wall portion 450c of the magazine cassette 450.

By the provision of the opening/closing cover 550c as shown above, opening the opening/closing cover 550c allows the replacement work for the plates 6 to be carried out without removing the magazine cassette 550 from the base 52. Accordingly, the workability in such replacement work can be improved to a great extent. Also, by the inclusion of the posture guide members 590 in the opening/closing cover 550c, closing the opening/closing cover 550c after the housing of the plates 6 into the magazine cassette 550 allows the posture guide block of each plate 6 and the posture guide member 590 of the opening/closing cover 550c to be engaged with each other, so that the posture of each plate 6 can be maintained normal by the engagement. It is noted that an opening portion that appears after the opening of the opening/closing cover 550c serves as a plate-replacement use opening portion.

Furthermore, when the plate 6 is housed in the magazine cassette 550 not in a horizontal state but in a skewed posture, the posture guide block and the posture guide member 590 cannot be engaged with each other, making it impossible to completely close the opening/closing cover 550c. Taking advantage of such a characteristic, when the operator closes the opening/closing cover 550c after an end of replacement work for the plates 6 in the magazine cassette 550, it can be decided whether or not the plates 6 have been housed in a normal posture, by checking the opening/closing cover 550c for its complete closure.

Furthermore, instead of the case where the opening/closing state of the opening/closing cover 550c is checked visually by the operator as shown above, the case may be that an opening/closing detection sensor 580 capable of detecting an opening/closing state is included in the opening/closing cover 550c. For instance, as shown in FIGS. 36 and 37, with a detected part 580a for the opening/closing detection sensor 580 included in the opening/closing cover 550c, a detector 580b may be included on the body side of the magazine cassette 550 so that the detected part 580a becomes detectable upon a closure of the opening/closing cover 550c.

By the opening/closing detection in a control-related manner, visual mis-recognition by the operator or the like can be prevented, allowing a reliable detection to be fulfilled, and moreover making it possible, for example, to provide an interlock circuit for allowing the component feeder to operate only after detection of a closure of the opening/closing cover 550c by the opening/closing detection sensor 580.

Also, as shown in FIG. 37, under the magazine cassette 550 is provided a plate housing part 570 which allows the plate 6 to be put into and out of the magazine cassette 550 by the plate moving device 40 in a state that the magazine cassette 550 has been moved by the cassette up/down unit 51 to a position, e.g. origin position, where the stored plates 6 can be replaced. In this plate housing part 570, for example, only one plate 6 can be housed, so that with respect to the magazine cassette 550 that has been moved to the origin position, the plates 6 housed in the plate housing part 570 can be extracted by the plate moving device 40 to implement the feed of the components 2, and besides the plate 6 over the feed of the components 2 can be housed in the plate housing part 570, even during the replacement work of the plates 6.

By the inclusion of such a plate housing part 570 in the magazine cassette 550, even while the replacement work of the plates 6 housed in the magazine cassette 550 is going on, component feed can be continuously carried out by using the plates 6 housed in the plate housing part 570, so that efficient component feed can be implemented.

Figure 38A:
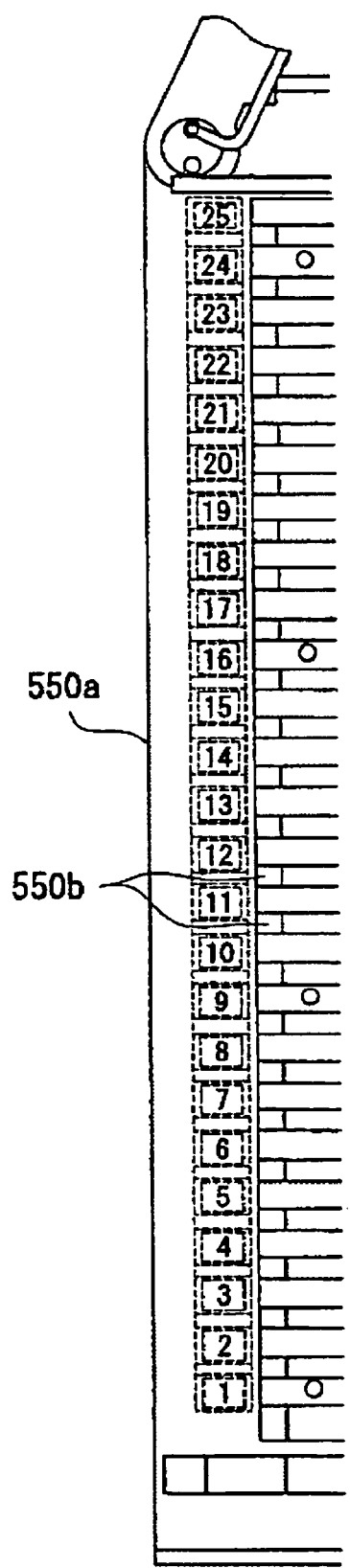
FIG. 38A is a view showing a left-side end portion out of opening end portions for opening/closing cover use in the magazine cassette body.
Figure 38B:
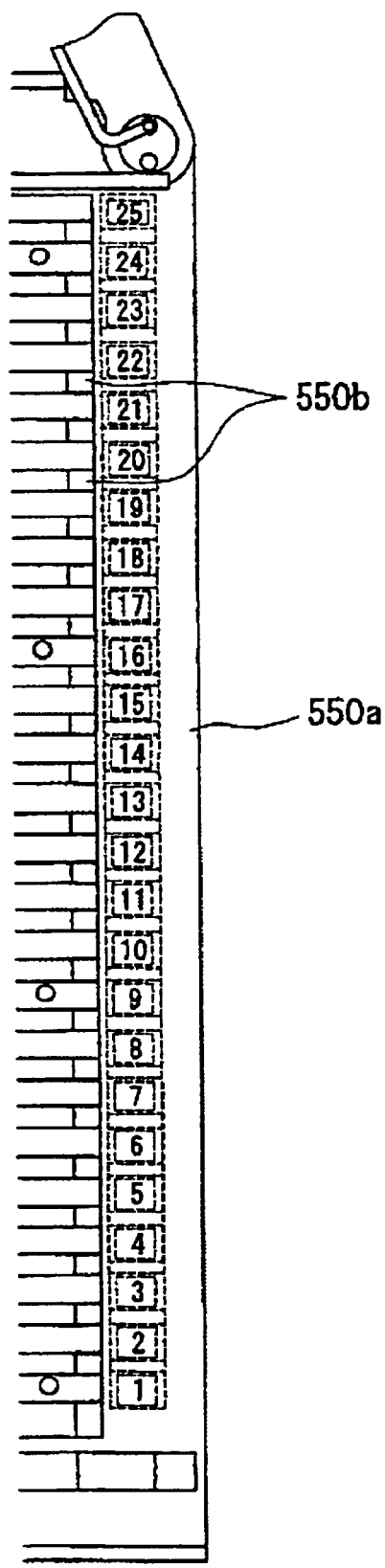
FIG. 38B is a view showing a right-side end portion out of the opening end portions for opening/closing cover use in the magazine cassette body.

FIGS. 38A and 38B are partly enlarged views (of the left side and the right side, respectively) of a side wall portion 550a at an opening end portion of the opening/closing cover 550c in the body portion of the magazine cassette 550. As shown in these figures, for example, step numbers as an example of the identification mark portions may be expressed for each mutually opposing set of recess portions 550b included inside the magazine cassette 550. In such a case, in the housing of the plates 6 into the magazine cassette 550 by the operator, mistakes in step number between right and left recess portions 550b can be prevented.

A procedure for the replacement work of the plates 6 housed in the magazine cassette 550 by taking advantage of the structures described above is shown in a flowchart of FIG. 39 as plate replacement work steps (or component feed work processes).

Figure 39:
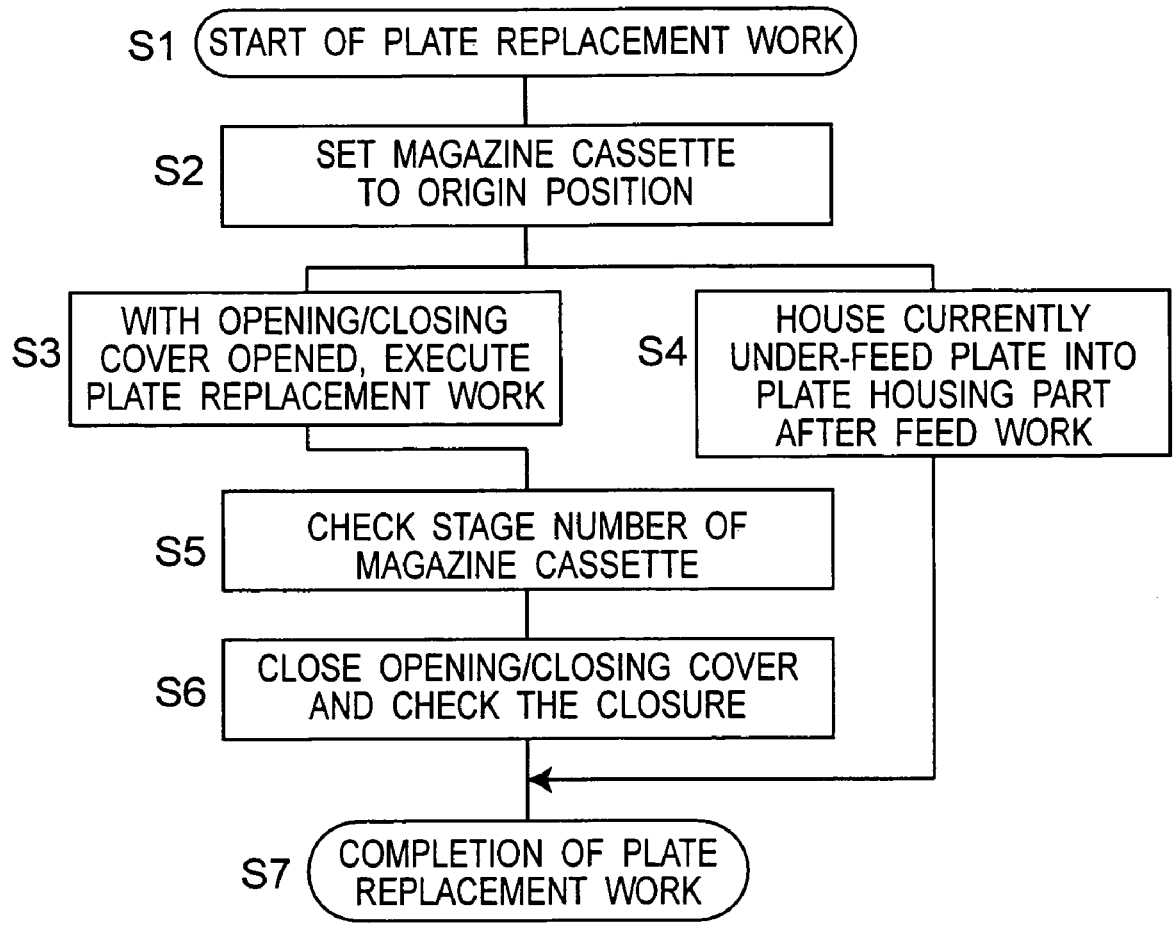
FIG. 39 is a flowchart showing a procedure of plate replacement working processes.

As shown in FIG. 39, at step S1, the plate replacement work is started. This start of work can be executed by operating a control unit or the like included in the component mounting apparatus to, for example, a replacement work mode. Next, at step S2, the magazine cassette 550 is made up or down by the cassette up/down unit 51 so as to be positioned to the origin position.

Thereafter, at step S3, the opening/closing cover 550c of the magazine cassette 550 is opened, in which case the replacement work of the plates 6 is carried out. At this point, if a plate 6 is under component feed and the component feed has been completed in the plate placement device 12, this plate 6 can be housed into the plate housing part 570 by the plate moving device 40 (step S4).

Upon completion of the replacement work for the plates 6, at step S5, step numbers at which the housing of the plates 6 has been done are checked, by which it is ensured that the plates 6 are not housed in a skewed posture. Thereafter, the opening/closing cover 550c is closed, and checking this closure makes it possible to ensure that the plates 6 have been housed in a normal posture. In addition, this checking of closure can be performed also by the opening/closing detection sensor 580. Thus, the plate replacement work is completed (step S7).

By the plate replacement work performed in such a procedure described above, the replacement of plates can be carried out smoothly and efficiently without interrupting the component feed work by the component feeder, so that efficient component feed becomes achievable.

Figure 41:
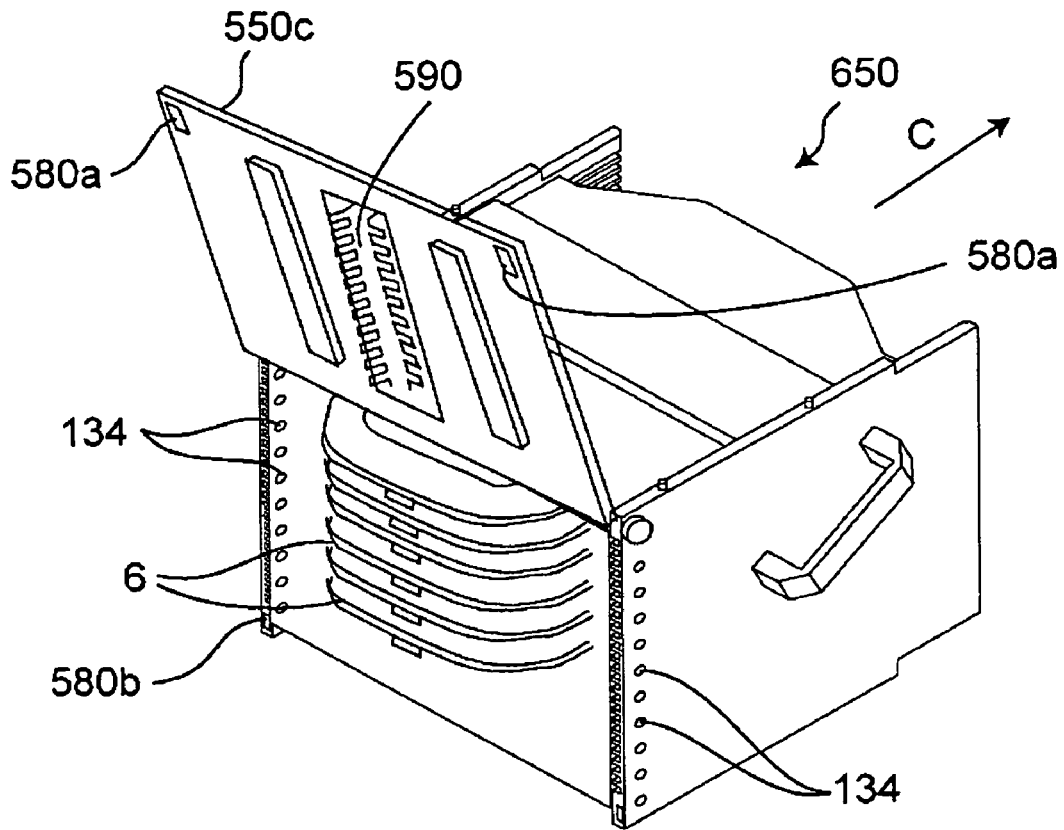
FIG. 41 is a schematic view of the magazine cassette of the third embodiment in which identification mark portions of the second embodiment are formed.
Figure 42:
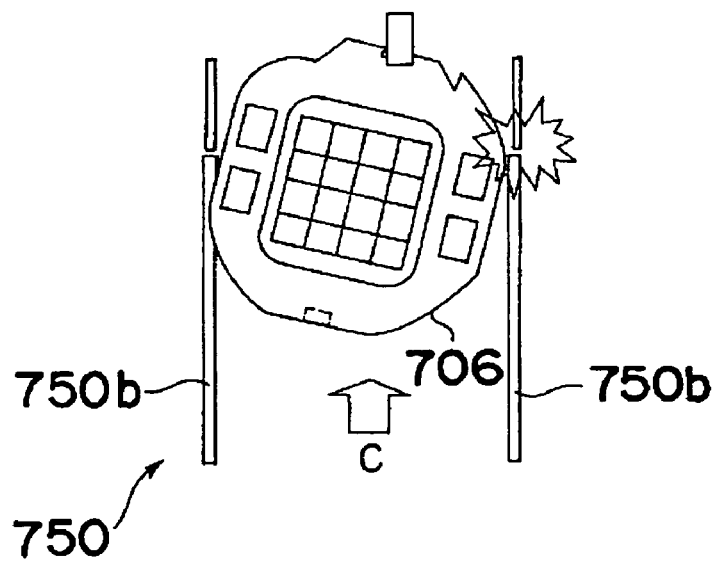
FIG. 42 is a schematic explanatory view of a magazine cassette according to a prior art, where a plate in an inclined state is being extracted horizontally with respect to the plate extraction direction.
Figure 43:
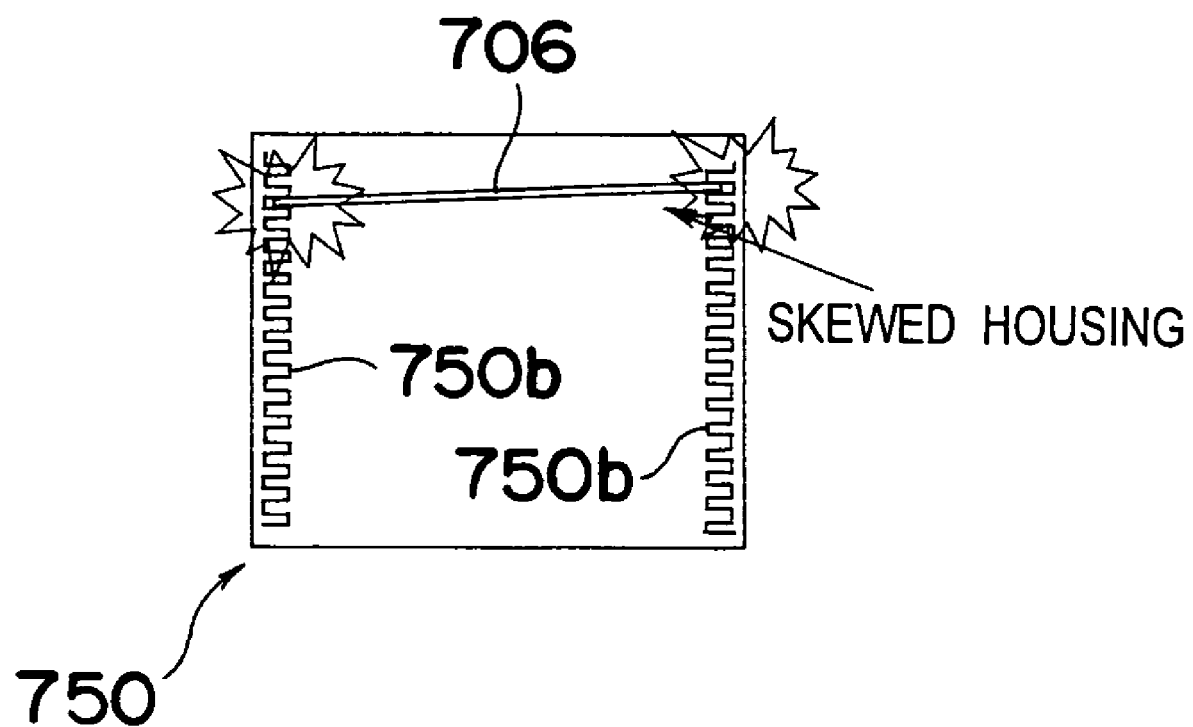
FIG. 43 is a schematic explanatory view showing a state that a plate is housed in a skewed posture in the magazine cassette of the prior art.

The above magazine cassette 550 has been described on a case where step numbers are expressed to identify paired sets of recess portions 550b. However, instead of such a case, the identification mark portions 134 used in the magazine cassette 50 of the first embodiment may also be used, as in a magazine cassette 650 shown in FIG. 41. The selection of a structure like this may be determined by taking into consideration time and labor required for the work of forming the identification mark portions or the like.

It is to be noted that, by properly combining the features of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosure of Japanese Patent Application No. 2004-142984 filed on May 13, 2004 including specification, drawing and claims are incorporated herein by reference in its entirety.

The invention claimed is:

1. A receiver for component feed plates, the receiver comprising:
   a pair of side wall portions;
   a plurality of paired sets of support guide portions fixed on the side wall portions for supporting mutually opposing end portions of a plurality of component feed plates on which a plurality of components to be mounted on a board are feedably placed, the support guide portions being configured such that the plates are supported in a generally horizontal support posture so as to be movable and guidable along a plate feed direction extending along surfaces of the component feed plates; and
   a plurality of identification mark portions formed as through holes in side faces of the pair of side wall portions such that each paired set of support guide portions is distinguished from the other paired sets of support guide portions,
   wherein the plates are supported at their end portions by the individual paired sets of support guide portions identified by the identification mark portions such that the plates are housed in multi-stage stacks, and
   wherein the support guide portions guide the component feed plates as the component feed plates are moved in the plate feed direction for feed of the components placed thereon.

2. A receiver for component feed plates, the receiver comprising:
   a pair of side wall portions;
   a plurality of paired sets of support guide portions fixed on the side wall portions for supporting mutually opposing end portions of a plurality of component feed plates on which a plurality of components to be mounted on a board are feedably placed, the support guide portions being configured such that the plates are supported in a generally horizontal support posture so as to be movable and guidable along a plate feed direction extending along surfaces of the component feed plates; and
   a plurality of recessed identification mark portions formed so as to extend along the plate feed direction in an outer peripheral surface of the pair of side wall portions, the recessed identification marks being open at end portions of the side wall portions, such that each paired set of support guide portions is distinguished from the other paired sets of support guide portions,
   wherein the plates are supported at their end portions by the individual paired sets of support guide portions identified by the identification mark portions such that the plates are housed in multi-stage stacks, and
   wherein the support guide portions guide the component feed plates as the component feed plates are moved in the plate feed direction for feed of the components placed thereon.

3. The receiver for component feed plates as defined in claim 1, wherein the identification mark portions are arranged with respect to the paired sets of support guide members such that paired sets of support guide portions at which an identification mark portion is placed alternate vertically paired sets of support guide portions at which an identification mark is not placed.

4. The receiver for component feed plates as defined in claim 1, further comprising a plurality of posture guide members which are placed between the support guide portions of each of the sets of the support guide portions and which are to be engaged with the plates to guide support posture of the plates in the plate feed direction.

5. The receiver for component feed plates as defined in claim 1, wherein smooth surface portions having smooth curved surfaces are formed at contact portions of the housed plates with the individual support guide portions.

6. The receiver for component feed plates as defined in claim 5, wherein mutual contact surfaces between the plates and the support guide portions, respectively, are formed such that hardness of the support guide portion is lower than hardness of the plate in the individual contact surfaces.

7. The receiver for component feed plates as defined in claim 5, wherein mutual contact surfaces between the plates and the support guide portions, respectively, are formed such that hardness of the end portion side of the plate is lower than hardness of the support guide portion in the individual contact surfaces.

8. The receiver for component feed plates as defined in claim 5, wherein each of the support guide portions includes a roller which is rotatable along a surface of an end portion of the plate while supporting the end portion.

9. The receiver for component feed plates as defined in claim 1, wherein a plurality of fixing members are provided at bottom portions of the receiver confronting a base that supports the receiver by which positions of the support are fixed, and at least one of the fixing members is formed of an electrically conductive material to function as a grounding terminal.

10. The receiver for component feed plates as defined in claim 1, wherein each of the component feed plates is a disc-shaped wafer feed plate for placing thereon a wafer with a plurality of wafer feed components placed thereon as the individual components, or a tray feed plate on which a component feed tray with a plurality of tray feed components placed thereon as the individual components and which has an outer peripheral configuration generally similar to that of the wafer feed plate, and
   wherein the wafer feed plate and the tray feed plate are compositely housed in stacked-up stages.

11. A component feeder comprising:
    the receiver for component feed plates as defined in claim 10;
    a plate placement device for holding one of plates out of the individual plates selectively placed so that the wafer feed components are fed from the wafer or the tray feed components are fed from the component feed tray; and
    a plate moving device for releasably holding the plates and extracting the plates from the plate storage device, and moving the plates to the plate placement device so that the plate placement device can hold the plates.

12. A receiver for component feed plates, the receiver comprising:
    a pair of side wall portions;
    a plurality of paired sets of support guide portions fixed on the side wall portions for supporting mutually opposing end portions of a plurality of component feed plates on which a plurality of components to be mounted on a board are feedably placed, each of the component feed plates having an outer peripheral portion formed of linear portions and curved portions, and the support guide portions being configured such that the plates are supported in a generally horizontal support posture so as to be movable and guidable along a plate feed direction extending along surfaces of the component feed plates; and a plurality of posture guide members which are placed between the support guide portions of each of the sets of the support guide portions, each of the posture guide members having a pair of engagement portions to be engaged with posture guide blocks provided in the plates, a distance between the pair of the engagement portions being tapered, wherein the engagement portions guide support posture of the plates in the plate feed direction while making a correction of the support posture during engagement of the posture guide blocks with the engagement portions, wherein the plates are supported at their end portions by the individual paired sets of support guide portions and are guided in their support posture by the posture guide members such that the plates are housed in multi-stage stacks, and wherein the support guide portions guide the component feed plates as the component feed plates are moved in the plate feed direction for feed of the components placed thereon.

13. The receiver for component feed plates as defined in claim 12, further comprising a door which is openable and closable to allow for replacing the plates, wherein the posture guide members are placed inside the door.

14. The receiver for component feed plates as defined in claim 12, wherein each of the component feed plates is a disc-shaped wafer feed plate for placing thereon a wafer with a plurality of wafer feed components placed thereon as the individual components, or a tray feed plate on which a component feed tray with a plurality of tray feed components placed thereon as the individual components and which has an outer peripheral configuration generally similar to that of the wafer feed plate, wherein the receiver is configured to house therein the wafer feed plate and the tray feed plate compositely, and wherein the posture guide blocks are provided in each of the tray feed plates, and the posture guide members are to be engaged with the posture guide blocks of the tray feed plates, respectively, so as to guide support posture of the tray feed plates while making a correction of the support posture during engagement of the posture guide blocks with the engagement portions.

15. The receiver for component feed plates as defined in claim 10, wherein the tray feed plate includes a tray ring which is an annular plate, and a tray placement portion which is provided at an inner peripheral portion of the annular shape of the tray ring and on which a plurality of component feed trays are to be placed so as to be fittable and removable, and wherein the tray placement portion is provided at a height position lower than a top face of the tray ring, and the tray feed plate is formed such that the top-face height position of each of the tray feed components stored in the component feed tray placed on the tray placement portion becomes generally equal to a height position of the wafer feed components in the wafer feed plate.

16. The receiver for component feed plates as defined in claim 10, wherein in the tray feed plate to be housed, a detection-use identification mark for discriminating between the tray feed plate and the wafer feed plate is formed in proximity to an end portion of the tray feed plate in a plate extraction direction.

17. The receiver for component feed plates as defined in claim 2, wherein the identification mark portions are arranged with respect to the paired sets of support guide members such that paired sets of support guide portions at which an identification mark portion is placed alternate vertically paired sets of support guide portions at which an identification mark is not placed.

18. The receiver for component feed plates as defined in claim 2, further comprising a plurality of posture guide members which are placed between the support guide portions of each of the sets of the support guide portions and which are to be engaged with the plates to guide support posture of the plates in the plate feed direction.

19. The receiver for component feed plates as defined in claim 2, wherein each of the component feed plates is a disc-shaped wafer feed plate for placing thereon a wafer with a plurality of wafer feed components placed thereon as the individual components, or a tray feed plate on which a component feed tray with a plurality of tray feed components placed thereon as the individual components and which has an outer peripheral configuration generally similar to that of the wafer feed plate, and wherein the wafer feed plate and the tray feed plate are compositely housed in stacked-up stages.

20. The receiver for component feed plates as defined in claim 12, wherein the receiver is configured to support wafers which are non-circular, and wherein the support guide portions and the posture guide members are configured to engage the component feed plates such that the component feed plates are not rotatable in the receiver.

21. The receiver for component feed plates as defined in claim 1, wherein the through holes extend from a first side of the side wall portions to a second side of the side wall portions, the second side being opposite to the first side.

* * * * *